(12) United States Patent
Meylan

(10) Patent No.: US 11,133,349 B2
(45) Date of Patent: Sep. 28, 2021

(54) SHORT-WAVE INFRARED DETECTOR ARRAY AND FABRICATION METHODS THEREOF

(71) Applicant: IRIS INDUSTRIES SA, Saint-Aubin-Sauges (CH)

(72) Inventor: Claude Meylan, Saint-Aubin-Sauges (CH)

(73) Assignee: IRIS INDUSTRIES SA, Saint-Aubin-Sauges (CH)

(*) Notice: Subject to any disclaimer, the term of this patent is extended or adjusted under 35 U.S.C. 154(b) by 0 days.

(21) Appl. No.: 16/764,498

(22) PCT Filed: Nov. 21, 2017

(86) PCT No.: PCT/EP2017/079964
§ 371 (c)(1),
(2) Date: May 15, 2020

(87) PCT Pub. No.: WO2019/101300
PCT Pub. Date: May 31, 2019

(65) Prior Publication Data
US 2020/0357833 A1 Nov. 12, 2020

(51) Int. Cl.
*H01L 27/146* (2006.01)
*H01L 21/263* (2006.01)
*H01L 21/306* (2006.01)

(52) U.S. Cl.
CPC ...... *H01L 27/1469* (2013.01); *H01L 27/1465* (2013.01); *H01L 27/14687* (2013.01);
(Continued)

(58) Field of Classification Search
None
See application file for complete search history.

(56) References Cited

U.S. PATENT DOCUMENTS

| 9,558,973 B2* | 1/2017 | Hawryluk | ......... H01L 21/02675 |
| 2011/0031401 A1* | 2/2011 | Mitra | ..................... H01L 31/107 |
| | | | 250/338.4 |

(Continued)

FOREIGN PATENT DOCUMENTS

| JP | 63-29924 | 2/1988 |
| WO | WO 2014/080021 | 5/2014 |
| WO | WO 2016/097850 | 6/2016 |

OTHER PUBLICATIONS

International Search Report, PCT/EP2017/079964, dated Jul. 19, 2018.

(Continued)

*Primary Examiner* — Benjamin P Sandvik
(74) *Attorney, Agent, or Firm* — Nixon & Vanderhye

(57) ABSTRACT

Disclosed are methods of fabricating short-wave infrared detector arrays including readout and absorption wafers connected by a recrystallized a-Si layer. The absorber wafer includes a SWIR conversion layer with a $Ge_{1-x}Sn_x$ alloy composition. Process steps realize the readout wafer and a portion of the absorption wafer, including bonding the readout wafer and a first portion of the absorption wafer. The a-Si intermediate layer linking the readout wafer and the first portion of the absorption wafer the a-Si intermediate layer is recrystallized by applying heat by a light source. The method assures a temperature profile between the light entrance surface and the CMOS electronic layer of the readout wafer maintaining readout layer temperature <350° C. during recrystallization. After the recrystallization process step the absorption wafer is completed by depositing the SWIR conversion layer. Also disclosed is a SWIR detector array realized by the method and SWIR detector array applications.

33 Claims, 13 Drawing Sheets

(52) U.S. Cl.
CPC .... *H01L 27/14698* (2013.01); *H01L 21/2636* (2013.01); *H01L 21/30625* (2013.01); *H01L 27/14627* (2013.01)

(56) References Cited

U.S. PATENT DOCUMENTS

| | | | |
|---|---|---|---|
| 2012/0260847 A1 | 10/2012 | Van Der Wilt | |
| 2014/0057457 A1* | 2/2014 | Wang | H01L 27/14634 438/778 |
| 2018/0012916 A1* | 1/2018 | Na | H01L 31/1812 |

OTHER PUBLICATIONS

Hiroshi Kanbe et al: "Crystallographic Properties of Ge/Si Heterojunctions Fabricated by Wet Wafer Bonding", Journal of Electronic Materials, vol. 39, No. 8, Aug. 1, 2010 (Aug. 1, 2010), pp. 1248-1255, XP055139964, ISSN: 0361-5235, DOI 10.1007/s11664-010-1228-y, section "Low-temperature annealed samples" figures 5-10.

* cited by examiner

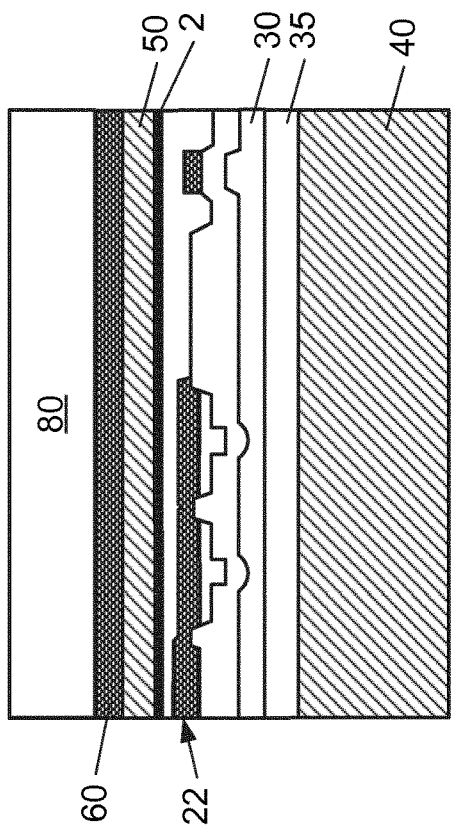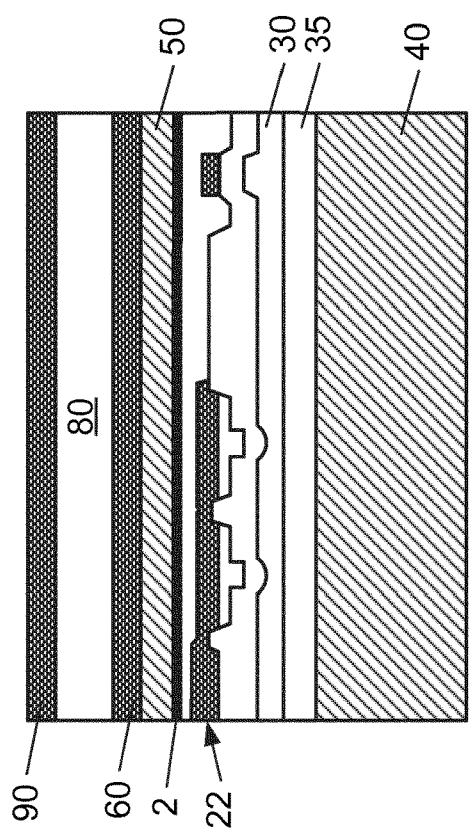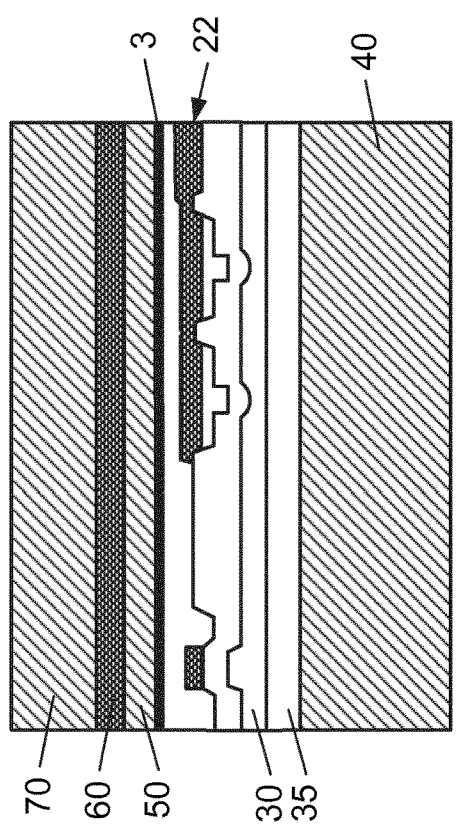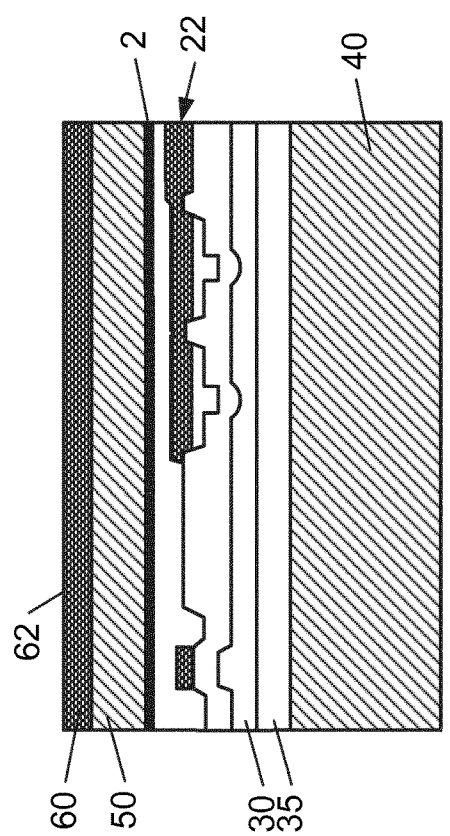

SHORT-WAVE INFRARED DETECTOR ARRAY AND FABRICATION METHODS THEREOF

TECHNICAL FIELD

The invention relates to the manufacturing of electromagnetic radiation detector arrays for detection and imaging comprising Complementary Metal Oxide Semiconductor (CMOS) circuits and absorption materials, both sensitive to high temperature. The invention relates to the 3D sequential integration of a temperature sensitive conversion layer and a CMOS readout circuit allowing for high detection efficiency. More precisely the invention relates to a short-wave infrared detector array.

STATE OF THE ART

Imaging detectors, equally named electromagnetic radiation detector arrays or Focal Plane Arrays (FPAs), employing direct conversion semiconductors absorbers can currently be implemented in two different ways. In the first one, the absorber is bonded by a bump-bonding technique onto the CMOS readout electronic wafer in order to realize the connections needed to process the electrical signal from every absorber pixel. Depending on the application, the semiconductor material used may vary greatly. The second implementation of imaging detectors comprises a monolithic, or 3D sequential integration process of the absorber, usually based on silicon (Si), with the readout electronics. Such monolithic active pixel sensors (MAPS) have been developed for charged particle tracking in which charge collection is realized by n-implants in a lightly p-doped epitaxial layer [Turchetta, 2001].

To achieve monolithic integrated CMOS imager sensors another possible path includes the use of a direct bonding process and related bonding equipment. With temperatures typically below 300° C. this bonding technique is applicable to CMOS-processed readout wafers that need to be thinned to a thickness of about 10 to 20 µm before the covalent bonding step in order to permit depletion of the highly resistive bonded absorber wafer. The result of this process is commonly a covalent bonding with a remaining amorphous silicon (a-Si) layer at the interface between two low temperature covalent bonded wafers [Flötgen, 2014]. Up to now, this interstitial layer of a-Si could be reduced to a thickness of 0.9 nm [Pönninger, 2015]. Thus,—in order to ensure an efficient charge collection—this a-Si layer still needs to be annealed at temperatures that cause no harm to the CMOS readout circuits (below 500° C.). This is equally true for the absorption structure as some alloys—such as $Ge_{1-x}Sn_x$ that may be used for short-wave infrared detection—show a low thermal stability and should preferably not be exposed to any heat source during the manufacturing process. With these constraints in mind, other technologies than furnace annealing need to be considered to recrystallize the a-Si interface, including all means to (1) reduce the process temperature, (2) protect the absorption layer from heat—or (3) change its nature into a less temperature sensitive material—, (4) focus energy on the a-Si layer by combined beams from multiple oscillators and (5) shorten the processing or dwell time to avoid the diffusion of temperature towards the CMOS readout layer.

It is well known in the art that low temperature polysilicon (LTPS) can be produced by exposing an a-Si surface layer to high intensity ultraviolet laser pulses that rapidly melt the deposited a-Si layer without heating the underlying substrate. Thanks to its low in-depth thermal diffusion, this technology is promising for high performance 3D sequential integration while it provides high dopant activation together with layer confined heating [Fenouillet-Béranger, 2015]. With appropriate materials and thickness, laser anneal at 100 ns pulse duration—the shorter the pulses the better—may provide a suitable solution to not exceed the 500° C. at the bottom level, of course, at expense of temperature uniformity inside the top layer. Thermal simulations of nanosecond annealing have even shown a safe 400° C. temperature at the bottom layer at a 50 ns laser pulse [Mathieu, 2015]. However, to achieve an FPA, the pulsed line beam should first be able to pass through the absorption structure. Unfortunately, some alloys—such as $Ge_{1-x}Sn_x$—are not transparent to ultraviolet. It means, conventional LTPS processing based on surface treatment with an excimer laser, or so-called excimer laser annealing (ELA), will certainly not contribute to the crystallization process. Even laser pulses delivered by two (or more) excimer lasers with combined beams from multiple oscillators resulting in fewer high-energy pulses generating less heat diffusion [US patent 20120260847] or a Q-switched, nanosecond pulsed Nd3+:YAG laser with a wavelength of 355 nm [Esther, 2016] cannot be used in this situation.

Alternatively, instead of the excimer laser or a Nd3+:YAG laser, a green laser such as frequency-doubled Nd:YAG laser using a 532 nm wavelength may be considered to heat the a-Si, supplying energy to nucleate grain growth. However, for the crystallization of an interfacial a-Si layer, the laser will very likely harm the absorption and the CMOS readout layers as the laser pulses and dwell time are too long.

Two different mechanisms in metal induced crystallization (MIC) of silicon to reduce processing time and temperature are also known to the art [Li, 2013]. Certain metals such as Al, Au or Ag form eutectic mixes with silicon leading to weaker covalent bonds in a-Si. This creates free Si atoms from the interface region with the metal layer that are highly mobile and diffuse, thus serving as catalyst for crystallization of a-Si at low temperatures. In an experimental study of aluminum-induced crystallization of amorphous silicon thin films [Qi, 2005], results showed that an a-Si film started crystallization at a temperature as low as 250° C. with a high crystallization rate achieved only at temperatures higher than 350° C. Other metals such as Pt, Co, Pd and Ni can form a silicide with Si by thermal annealing and act as nucleate sites. Migration of metal silicide triggered at moderate temperature—superior to 350° C.—leaves behind a trail of needle like crystallites in its wake. Interestingly, as the crystallization time elapses, crystallites continue to grow and eventually meet together. Unfortunately, MIC is ill-suited to the manufacturing of photo-electric components, sensitive by nature to metallic particles and contamination during the manufacturing process.

Owing to its insensitivity to surface reflectivity variations, microwave annealing (MWA) has been widely explored as an alternative to short pulse laser annealing processes, in particular for recrystallization of a-Si films [Xu, 2013]. But, similar to the previous MIC method, a susceptor wafer such as SiC or a Si wafer with proper doping concentration is needed to induce the regrowth of the amorphized Si layer. Other measures may use a metal film covering to absorb the microwave energy via ohmic conduction loss in the material. In the end, MWA is not suitable for photodiode manufacturing for the same reasons as for MIC.

Millisecond annealing by flash lamps (FLA) provides global heating—typically at 1200° C. and a dwell time of 10 ms—as the top surface of the entire wafer is heated at the same time. Due to the vertical thermal gradient, the backside needs to be floated to relieve the stress caused by wafer bending. The relative high peak surface temperature and dwell time at a rather slow ramp down the cooling is limited by the same radiation mechanism as rapid thermal annealing. The temperature profile adjustment to fine tune the junction depth may therefore be a concern.

Altogether, none of the previous mentioned annealing methods has been used so far for electromagnetic radiation detector manufacturing, in particular for crystallization of any interfacial a-Si layer below a temperature sensitive absorption layer. It is also understood that none of these methods taken alone related to covalent bonding—or any combinations of them—is proven or, even, supposed to solve the problem. On one side, lower substrate and peak annealing temperatures with a very short dwell time are required. On the other side, in case of temperature sensitive absorption materials such as $Ge_{1-x}Sn_x$ in a CMOS imager sensor, new manufacturing processes are called for in order to recrystallize the a-Si interfacial layer without any harm to the front or backside of the device. Furthermore, there exists a need for a simpler, and more cost-effective fabrication of 3D integrated CMOS imager sensors.

SUMMARY OF THE INVENTION

It is the aim of this invention to provide a short-wave infrared (SWIR) focal plane array (FPA) comprising a first absorption layer based on temperature sensitive semiconductor materials and a monolithic integrated CMOS wafer in order to allow for an efficient charge collection between both layers. To this end, the SWIR FPA of the invention is realized by applying crystallization energy to the residual a-Si interface after covalent bonding, comprising the step of using laser annealing at very short pulse duration, before providing the conversion layer on top of the first absorption layer.

More precisely the invention is achieved by a method of fabrication of a SWIR FPA comprising a readout wafer and an absorber wafer comprising a buffer layer. Said absorbing wafer comprises a $Ge_{1-x}Sn_x$ layer deposited on said buffer layer, and said readout wafer and absorbing wafer are separated by a recrystallized interfacial layer.

The method of the invention consists of the following steps (A-E):
A. fabricating a readout wafer comprising a CMOS readout layer having a first surface;
B. fabricating an absorber wafer, having a second surface, that comprises a buffer layer; in a variant said buffer layer is a Ge layer;
C. performing a covalent bonding between said first and second surfaces, providing a bonding interface;
D. sending light pulses, provided by a light source; the pulses are provided preferably by the combination of light beams from multiple oscillators resulting in fewer high-energy light pulses generating less heat diffusion; the light source is situated to the side opposite to said readout wafer relative to said buffer layer, to the direction and through said buffer layer and through an a-Si interfacial layer that separates said readout wafer and said absorber layer, and so as to recrystallize said a-Si interfacial layer by the heat provided by said light pulses, and so that temperature of the CMOS readout layer remains lower than 350° C. during the recrystallization process;
E. depositing on said buffer layer, at temperatures lower than 350° C., a layer of $Ge_{1-x}Sn_x$.

In an embodiment the recrystallization temperature of the a-Si interfacial layer, during the recrystallization process step D, remains lower than 650° C.

In an embodiment the recrystallization temperature of the a-Si interfacial layer during the recrystallization process step D is higher than 550° C.

In an embodiment the temperature of said buffer layer remains lower than 800° C. during the recrystallization step D of said a-Si interfacial layer.

In an embodiment the absorber wafer comprises, during the crystallization step D, a carrier layer that is situated on said buffer layer, to the side away of said a-Si interfacial layer. Said carrier layer has a top surface situated away from said buffer layer. The temperature profile, defined from said top surface to said readout layer, provided by said light pulses is such that:
 the temperature of said buffer layer is lower than 800° C. and the temperature of said a-Si interfacial layer is higher than 450° C.

In an embodiment said light pulses are provided at wavelengths comprised between 400 nm and 900 nm.

In an embodiment the pulse duration of said light pulses is lower than 1 ms and preferably lower than 100 ns.

In an embodiment the method comprising a step wherein the readout wafer and/or the absorber wafer undergo an ion or electron beam irradiation so that the recrystallization temperature of said a-Si interfacial layer is reduced by at least 100° C.

In an embodiment the fabrication of said readout wafer comprises the steps of:
 a1) providing a SOI type wafer being a low doped p or n type SOI wafer comprising a CMOS readout layer comprising readout electronics and a handle wafer;
 a2) deposit an oxide layer on said CMOS readout layer so as to provide a plane oxide layer surface;
 a3) realize a readout carrier layer on top of said plane oxide layer surface;
 a4) thinning said handle layer so as to provide an epitaxial layer;
 a5) doping said epitaxial layer so as to realize a p-n junction in said epitaxial layer;
 a6) providing a smooth, clean and oxide-free bonding surface by chemical mechanical polishing and passivating.

In an embodiment the fabrication of said absorber wafer comprises the steps of:
 b1) providing a substrate wafer having either a p-type doping or n-type doping opposite to the doping of said SOI type wafer, said substrate wafer having a growth surface;
 b2) growing a buffer layer having a first buffer layer surface to the side away from said substrate wafer. In an embodiment the buffer layer is a Ge layer. The buffer layer is preferably a strain-relaxed buffer layer having a low tensile strain. Said tensile strain is preferably lower than 0.26%;
 b3) realize a second carrier wafer on said first buffer layer surface;
 b4) thinning said substrate wafer;
 b5) providing a clean and oxide free substrate wafer surface;

In an embodiment the method comprises, after said recrystallization step E, the following additional steps:
 c1) removing said second carrier wafer;
 c2) providing an oxide-free Ge surface;
 c3) deposit a $Ge_{1-x}Sn_x$ absorber layer on said oxide-free Ge surface;

c4) deposit a Ge contact layer on said $Ge_{1-x}Sn_x$ absorber layer;
c5) removing said readout carrier layer;
c6) realize a secondary carrier on said Ge contact layer;
c7) realizing opening contacts through said oxide layer;
c8) forming electrical contacts to said readout layer;
c9) removing said secondary carrier;
c10) realizing on said readout layer a detector carrier layer;

In an embodiment said $Ge_{1-x}Sn_x$ absorber layer has a composition with a Sn content x between about $0.02 \leq x \leq 0.15$.

In an embodiment rods made of $Ge_{1-x}Sn_x$ are formed during said deposition process step E.

In an embodiment the method comprises the additional step of providing an optical layer on said Ge contact layer.

The invention is also achieved by a SWIR detector array comprising at least one SWIR light conversion layer having an incident light surface and a doped readout wafer, being either p-doped or n-doped, comprising:
an array of charge collecting areas being either p-doped or n-doped charge collecting areas;
an electrical circuit situated in said readout wafer and comprising a detector array configured to detect electromagnetic waves having a wavelength comprised between 1.0 µm and 3.0 µm, In an embodiment the SWIR detector array comprises a detector carrier layer to the side opposite to the SWIR light conversion layer relative to the incident light side.

The SWIR detector array further comprises a recrystallized intermediate layer situated at the bonding interface, said intermediate layer being arranged in between said substrate layer and said readout wafer.

A p-n junction is realized at the location of said recrystallized intermediate layer.

The SWIR light conversion layer has a $Ge_{1-x}Sn_x$ alloy composition and comprises, to the side away from said recrystallized intermediate layer a doped contact layer having a similar doping as said substrate layer.

In an embodiment said p-n junction is situated to the side of said $Ge_{1-x}Sn_x$ absorber layer.

In an embodiment said p-n junction is situated to the side of said readout layer.

In an embodiment said p-n junction comprises said bonding interface and having a first portion situated to the side of said $Ge_{1-x}Sn_x$ absorber layer and a second portion situated to the side of said readout layer.

In an embodiment said readout electrical circuit is a CMOS type circuit processed in said readout layer so as to be accessible in said detector lower surface.

In an embodiment said light conversion layer has a thickness t1, defined in a direction perpendicular to said support layer of more than 350 nm, preferably more than 1 µm, still preferably more than 5 µm.

In an embodiment said buffer layer is a patterned layer and comprises trenches and elevated regions to its incident light side. In variants said buffer layer has a low tensile stress, preferably lower 0.26%. The buffer layer is preferably made of Ge, possibly a doped Ge layer.

In an embodiment said SWIR light conversion layer is internally structured and comprises rods extending between said substrate layer and said doped contact layer.

In a variant said rods have, defined in any cross section perpendicular to their length L, a <100> crystallographic orientation.

In variants the greatest width of said rods, taken in any said cross section, is comprised between 1 µm and 7 µm.

In an embodiment the SWIR detector array comprises, to the incident light side, an optical layer adapted to direct incident light into said rods.

In variants the optical layer comprises an array of refractive microlens, or an array of diffractive microlenses, or an array of aspheric shaped microlenses, or an array of microprisms or an array of plasmonic planar metalenses allowing for multi/hyper-spectral imaging and analysis.

In an embodiment the SWIR detector is configured as a detector comprising an array of single-photon avalanche diodes.

BRIEF DESCRIPTION OF THE DRAWINGS

Further details of the invention will appear more clearly upon reading the following description in reference to the appended figures:

FIGS. 10-25 illustrate cross sections of process steps of the method of fabrication of the invention.

EMBODIMENTS OF THE INVENTION

Figure 1:
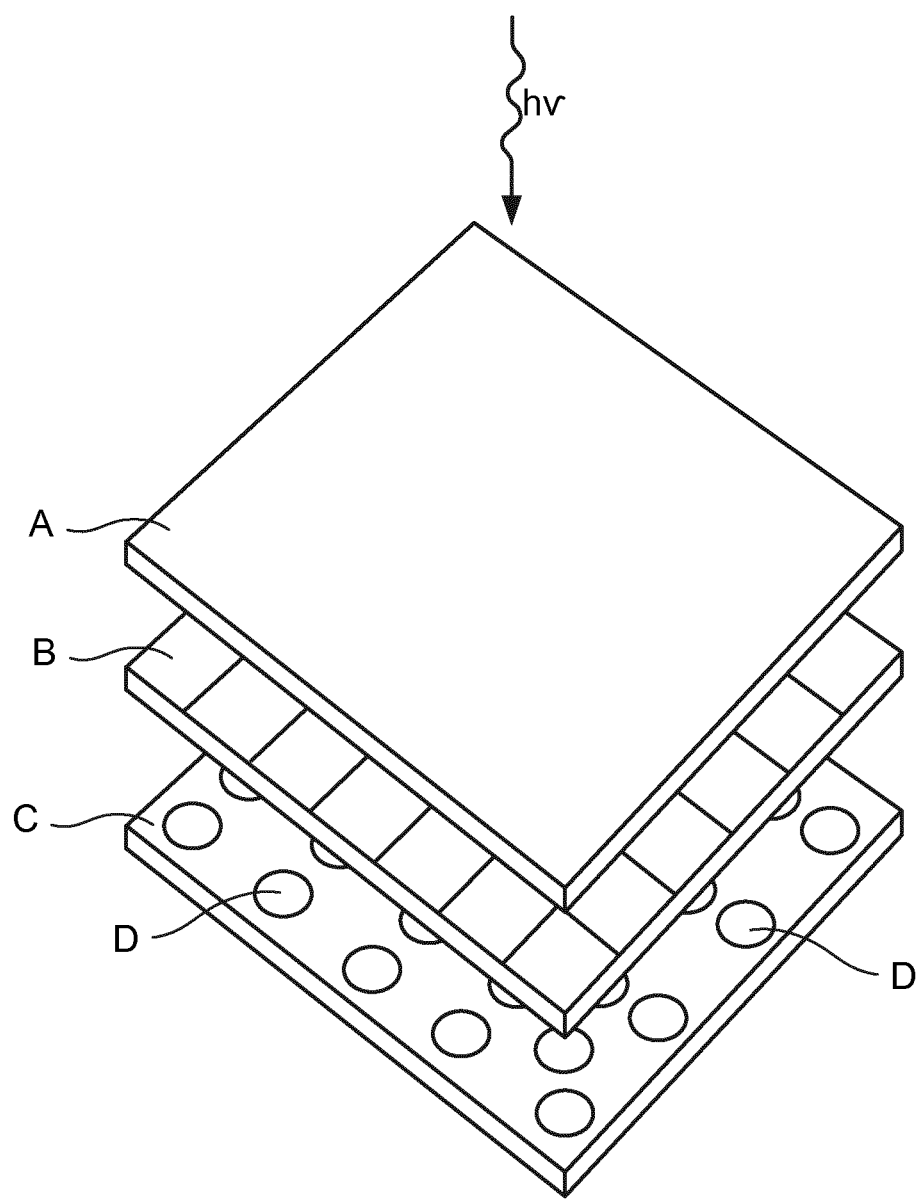
FIG. 1 illustrates a cross-section of a hybrid detector array of prior art having an absorber layer and a readout layer connected by bump-bonding.

FIG. 1 illustrates a SWIR detector array 1 of prior art. As described in the prior art such a detector array comprises typically a microlens array (A) and an absorber sheet typically made of InGaAs (B), as well as a readout circuit realized on a separate layer or wafer. The stack comprising the optical layer (A) and the absorber layer (B) is electrically and mechanically connected to the CMOS layer (C) by an array of bumps (D).

The hybrid assembly of prior art infrared detector arrays, as illustrated in FIG. 1, requires a complex and delicate alignment process and does not allow to provide large, cheap, reliable and high efficient SWIR detector arrays.

Compared to infrared detectors of prior art, the device of the invention provides a highly efficient monolithic SWIR detector array 1 comprising a simplified and wide layer stack structure having a small thickness, a reduced weight and lower power requirements. The SWIR detector array 1 of the invention is also called a focal plane array (FPA) hereafter. The device of the invention allows to provide very sensitive and large area monolithic FPAs able to cover efficiently the whole SWIR spectrum at room-temperature or eventually Peltier-cooled operation. Said SWIR spectrum is defined by a wavelengths range between 1.0 µm and 3.0 µm.

In a preferred embodiment, schematically illustrated in FIG. 2S, the short-wave infrared (SWIR) detector array 1 of the invention comprises at least one SWIR light conversion layer 80 and a doped readout wafer 20 being either p-doped or n-doped including:
- an array of charge collecting areas 24 being either p-doped or n-doped, as described and illustrated (FIG. 8b) further in the present document;
- an electrical circuit 22 and a readout layer 20c situated in said readout wafer 20, said readout layer 20c comprising a detector array 24 being configured to detect electromagnetic waves having a wavelength comprised between 1.0 µm and 3.0 µm.

Figure 2:
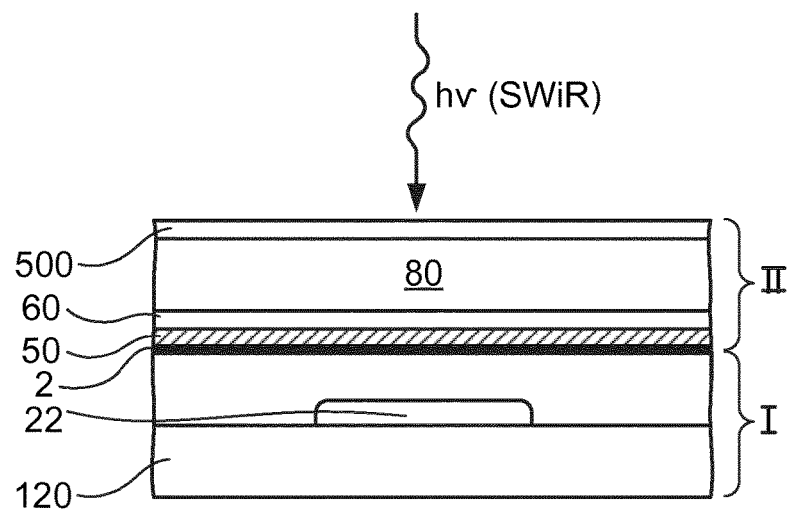
FIG. 2 illustrates a schematic cross-section of a complete SWIR photodiode structure of the invention, comprising a recrystallized interfacial layer.

In FIG. 2, the SWIR detector array 1 comprises a readout wafer I and an absorption wafer II. The readout wafer I comprises in said preferred embodiment a detector carrier layer 120 situated to the side opposite to the SWIR light conversion layer 80 incident light side. Said absorber wafer II comprises a substrate layer 50. The SWIR light conversion layer 80 of the SWIR detector array 1 has, in all embodiments, a $Ge_{1-x}Sn_x$ alloy composition.

The SWIR detector array 1 of the invention comprises in all its embodiments an intermediate layer 2 at the bonding interface (1c-1d) between said readout wafer I and said absorber wafer II. Said intermediate layer 2, which is a recrystallized Si intermediate layer 3 after thermal processing, as further explained in the method section, essential to the invention, is situated in between a substrate layer 50 of the absorber wafer II and said readout wafer 20.

Also, a p-n junction is realized at the location of said intermediate layer 2. Different variants of the location the p-n junction are further described in the present document.

Figure 6:
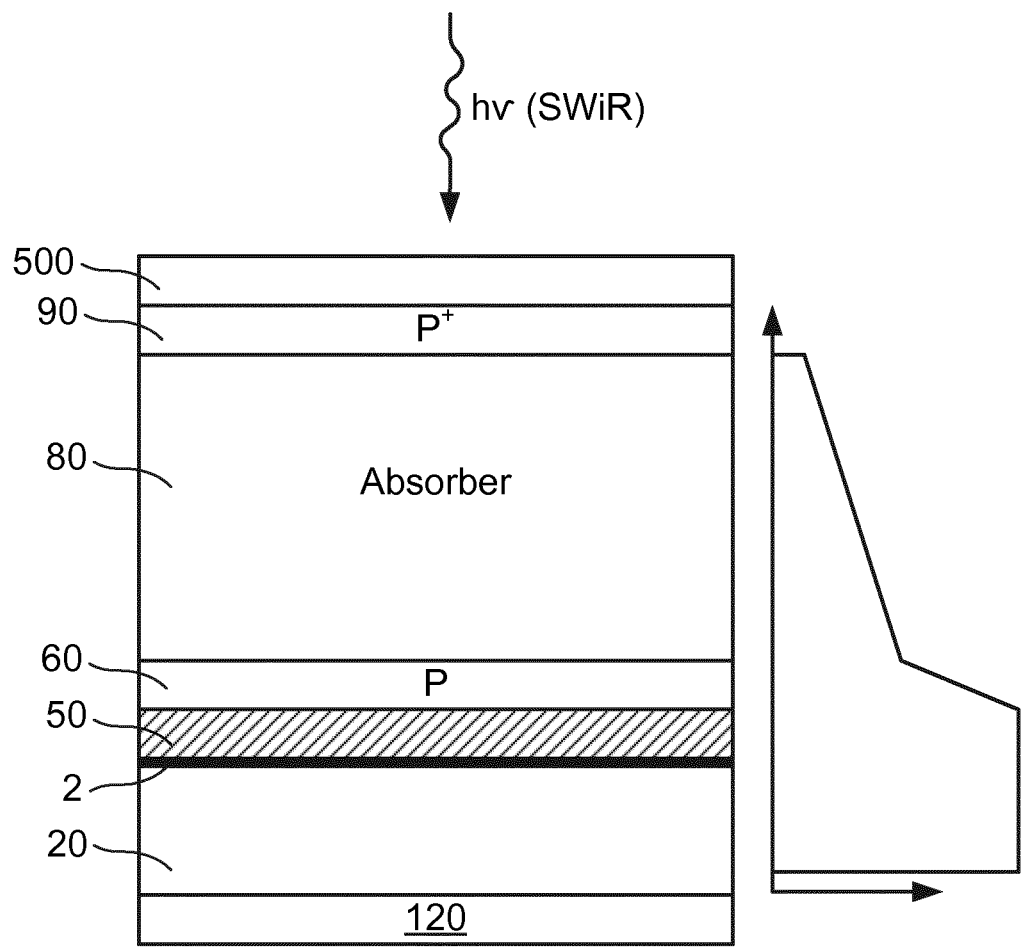
FIG. 6 illustrates a preferred embodiment of the invention comprising an avalanche layer stack configuration base on a $n^+$ layer, a p layer and a $p^+$ layer.

The stacked layer configuration comprising said SWIR conversion layer 80, said support layer 50, said a p-n junction, which is in electrical connection with said electric circuit 22 and the further described electrical contact layer 90, forms a SWIR avalanche photodetector array configuration. The array configuration of the detector 1 of the invention is formed by the electrical connection between the absorbing layer 80 and the array configuration of the electric charge collecting regions 24 as further described. FIG. 6 illustrates a typical distribution of the electric field across the SWIR detector.

The absorbing layer is arranged on a buffer layer 60. Preferably the buffer layer is a strain relaxed buffer layer 60, hereafter designated as SRB layer. The SRB layer 60 may be a Ge layer. The SRB layer has preferably a tensile stress lower than 0.26%.

In a variant said p-n junction is situated to the side of said $Ge_{1-x}Sn_x$ absorber layer 80. In another variant said p-n junction is situated to the side of said readout layer 20. In still another variant said p-n junction comprises said bonding interface and having a first portion situated to the side of said $Ge_{1-x}Sn_x$ absorber layer 80 and a second portion situated to the side of said readout layer 20.

In an embodiment said readout electrical circuit 22 is a CMOS type circuit processed in said readout layer 20c so as to be accessible in said detector lower surface 1b.

In an embodiment said light conversion layer 80 has a thickness t1, defined in a direction perpendicular to the substrate layer 50 of more than 350 nm, preferably more than 1 µm, still preferably more than 3 µm.

In an embodiment said SRB layer 60 is a patterned layer and comprises, in an embodiment, trenches 61 and elevated regions 63 to its incident light side.

Figure 4A:
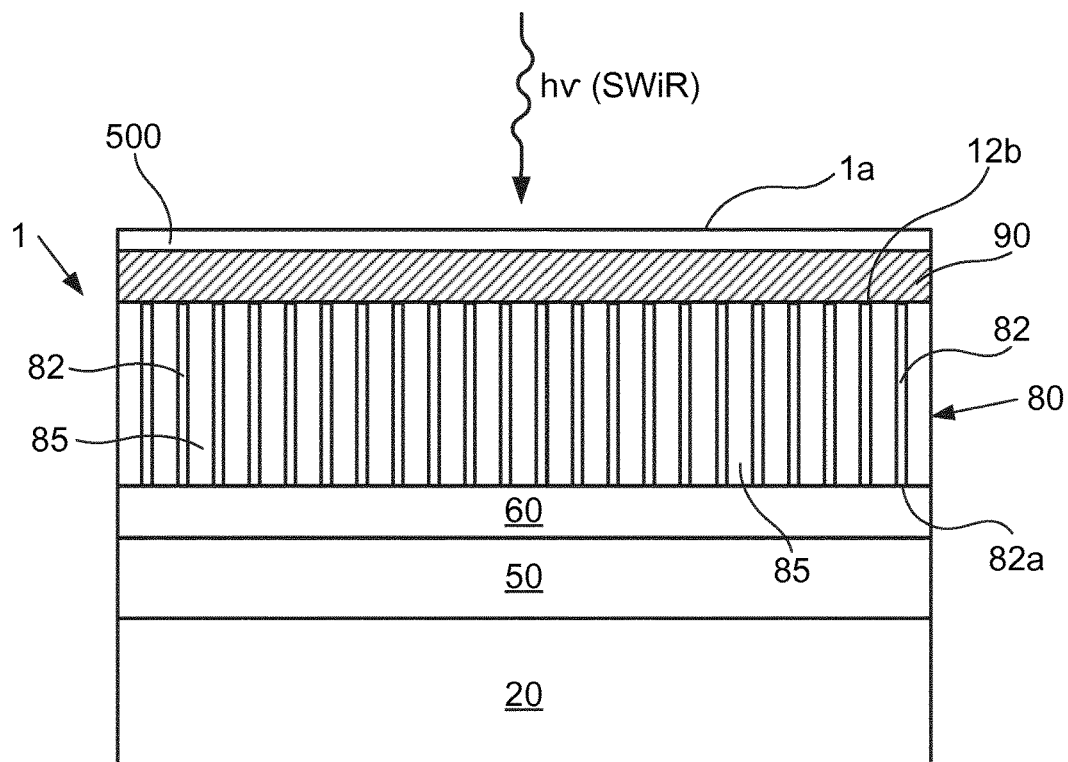
FIG. 4a-4c and FIG. 5 illustrate a detailed structure in the SWIR conversion layer comprising rods separated by gaps.
Figure 4B:
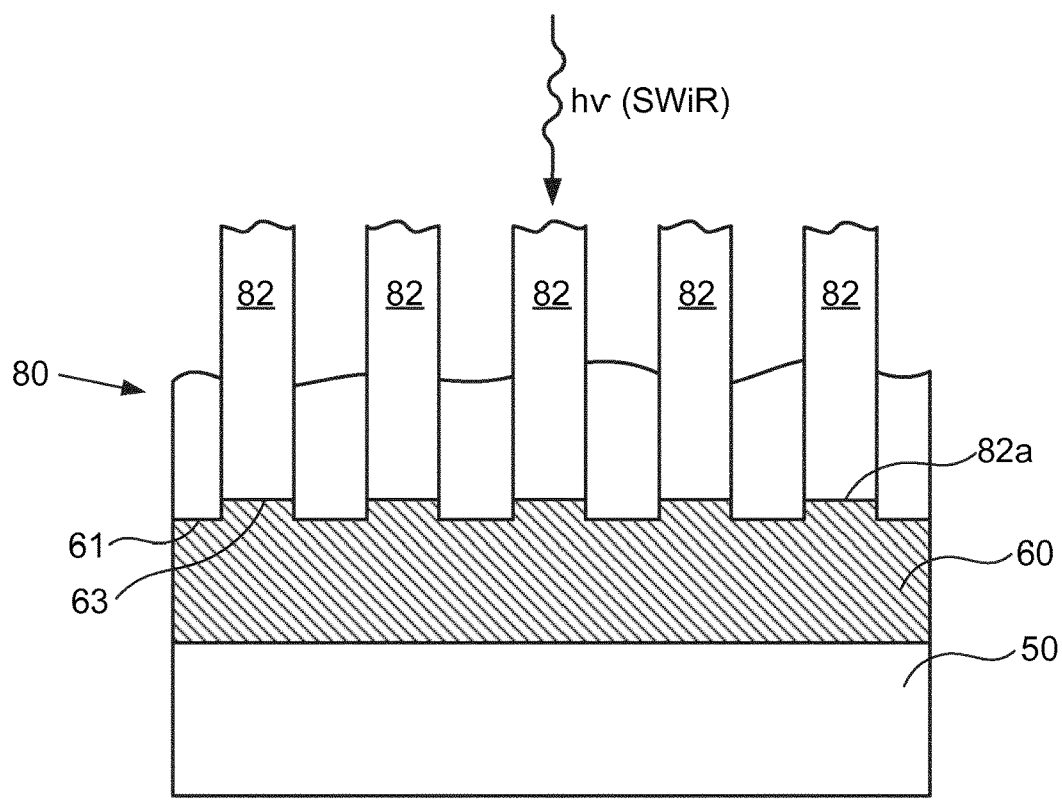
Figure 4C:
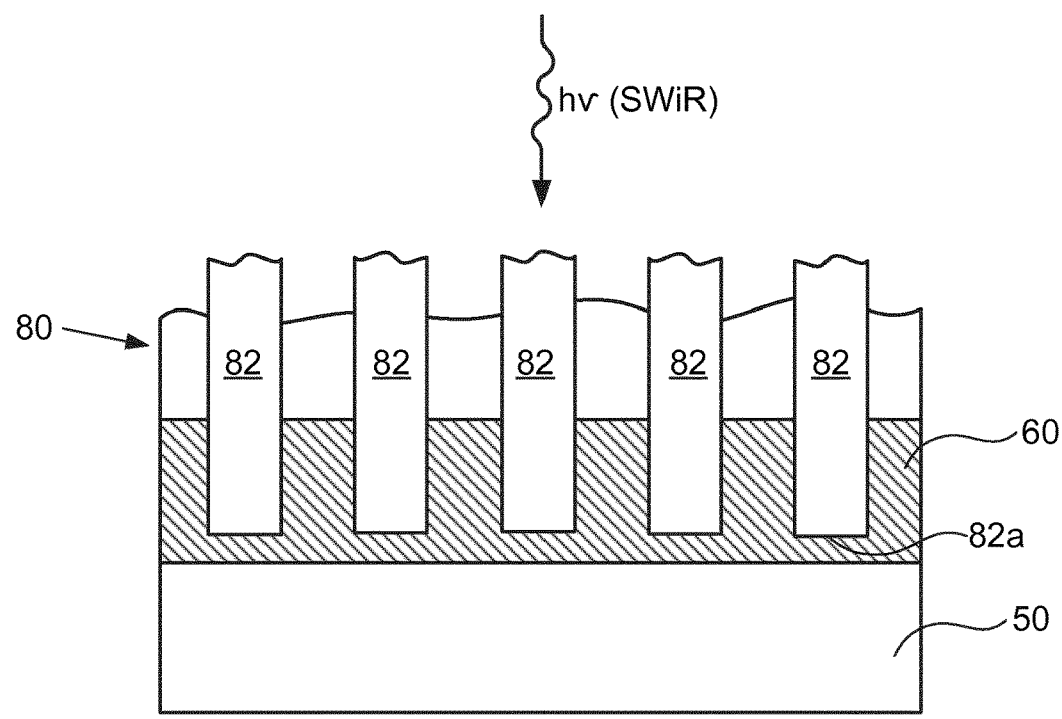
Figure 5:
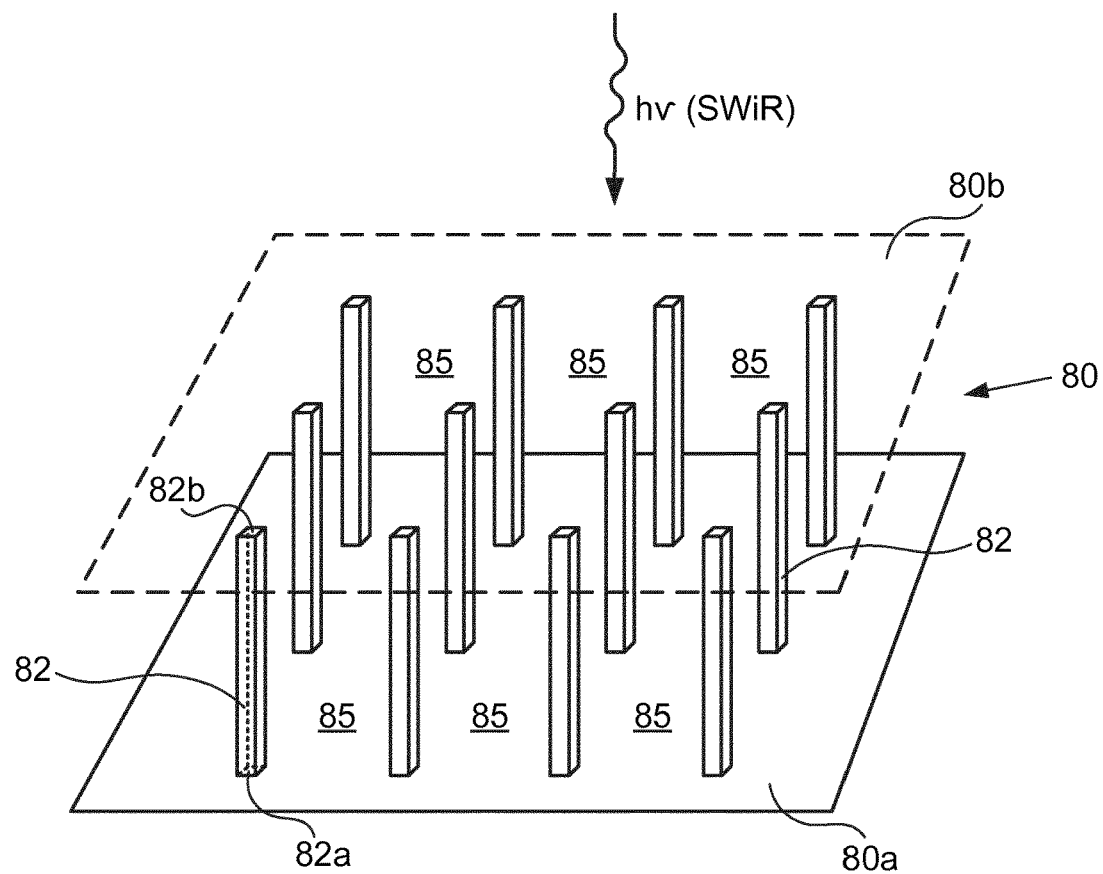
Figure 8A:
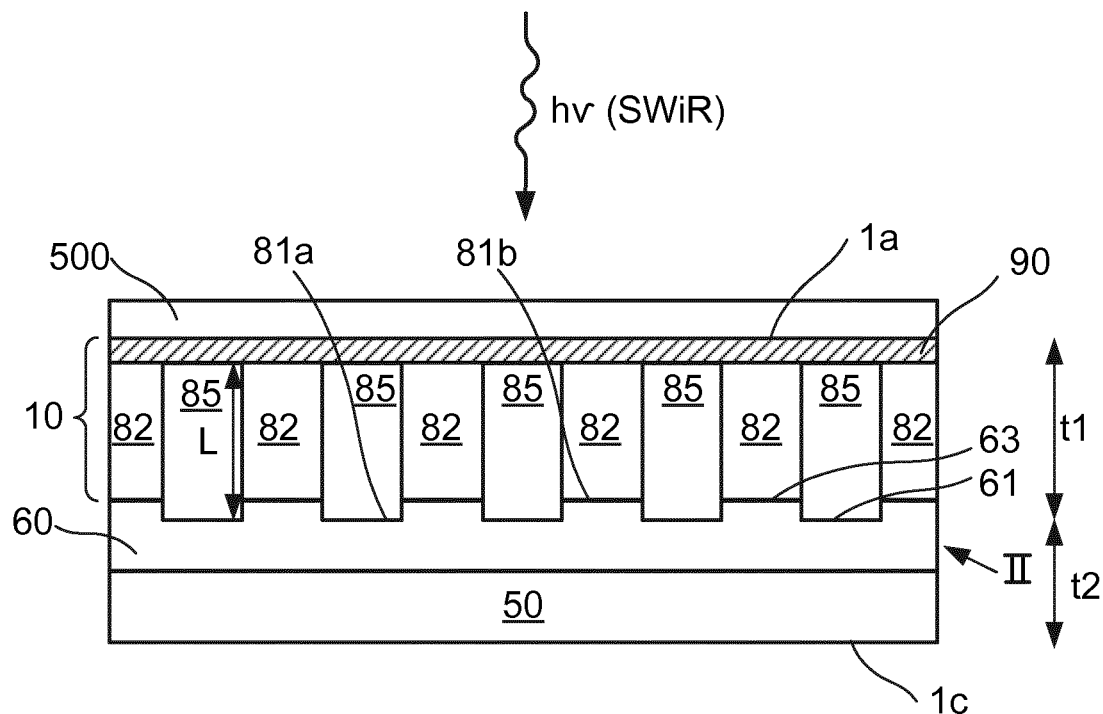
FIG. 8a-8b illustrates an embodiment of a readout wafer and absorption wafer.
Figure 8B:
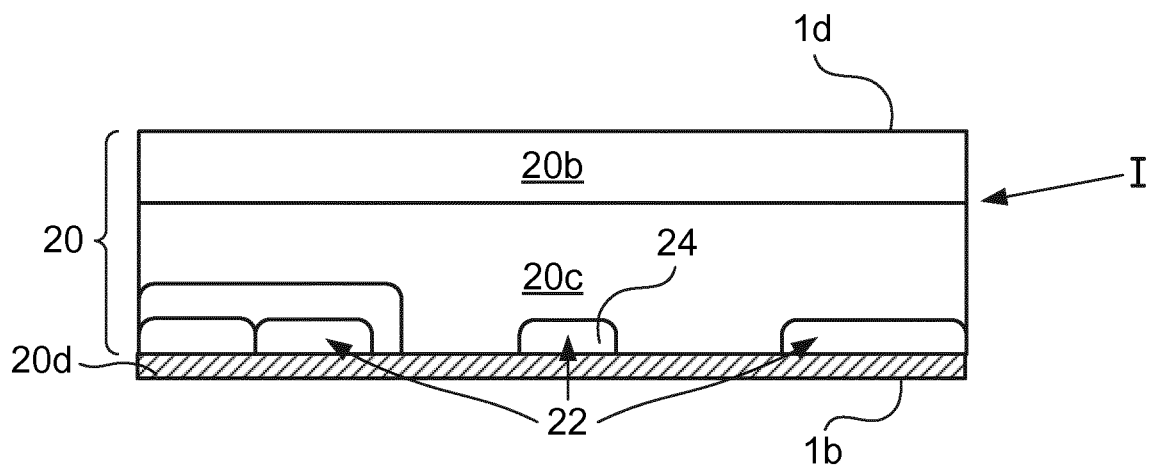

In another embodiment the FPA 1 of the invention, illustrated in FIG. 4a-4b, the SWIR detector array 1 comprises the following elements:
a) a contact layer 90 which may be a doped contact layer, possibly a Ge layer 90;
b) a SWIR conversion layer 80, also defined as absorption layer or light conversion layer, arranged for converting short wavelength infrared photons in electron-hole pairs; the SWIR conversion layer 80 has a $Ge_{1-x}Sn_x$ alloy composition and is, in the embodiment of FIG. 8a-8b, internally structured such that it comprises rods 82 extending between a patterned buffer layer 60, said contact layer 90 having a similar doping as the patterned buffer layer 60.
c) a readout wafer 20 comprising the COMS readout circuits 22, including electric charge collectors 24.

In a variant said contact layer 90 may have a different doping and comprise other materials than said buffer layer 60. Said contact layer may be a patterned contact layer.

It is understood that in the embodiment of FIG. 8a-b wherein the SWIR conversion layer 80 comprises rods, a support layer 50 may be provided that is possibly a patterned support layer. In the variant illustrated in FIG. 8 a-b, the support layer 50 is a substantially smooth layer 50.

In the embodiment comprising said rods 82, these rods 82 are grown by a low temperature epitaxial process, as described further, so that they have a well-defined crystallographic structure and present reduced defects, such as threading dislocations at the interface between a patterned seed layer 50 and the grown rods 82. Growing $Ge_{1-x}Sn_x$ alloy rods with an Sn content x between about $0.02 \leq x \leq 0.15$ on a support layer 60 allows also providing a structured absorption layer 80 rather than a continuous film, which provides, besides the extension of the absorption edge to longer wavelength compared with Ge, a detector device with higher performance thanks to low threading dislocation defects between lattice mismatched materials, a less stringent demand on temperature stability compared with the conventional III-V based photodetectors and a large responsivity at low power over the whole SWIR wavelength range. Depending on the alloy composition and the targeted quantum efficiency, the absorber material thickness t1 may be as thin as 10.0 µm to 20.0 µm or even 0.5 µm to 10.0 µm. The absorption layer 80 is realized preferably by the fabrication process of the invention as described further.

As illustrated in FIG. 8a-b said rods 82 are preferably formed, as further described in the section related to the fabrication method, on formed elevated regions but may also be formed on formed trenches of a patterned growth layer. Said rods 82 define a rod basis 82a on the substrate layer 50 and an upper surface 82b opposite to said basis 82a. Said trenches and/or said elevated regions may comprise microstructures or additional layers to limit defects during the formation of said rods.

Adjacent rods 82 are separated by gaps 85 as illustrated in FIG. 8. These gaps 85 may be filled with a passivation layer. This passivation layer may be a dielectric passivation layer and may be formed during or after the growth process of the rods 82.

Said gaps 85 may be filled with a material suitable to improve the confinement of infrared light into said rods 82, or may be suited to reduce the leakage of infrared light and/or electrical charges outside said rods 82. Said rods 82 may be arranged as an closely packed rod arrays, for example an array comprising substantially hexagonal shaped rods 82 that have at least one lateral face in contact with at least a portion of a face of a neighboring rod 82.

It is understood that the width of the gaps 85 between the rods 82 may be as small as allowed by the lithography and deep reactive ion etching techniques known in the art. For example the width of the gaps 85 may be lower than 1 μm, or below 500 nm or even below 100 nm.

A wide variety of packing densities and packing configurations are possible. For example, as illustrated in each charge collecting area 24 of the readout wafer 20 may face a predetermined number of rods 12.

Figure 7A:
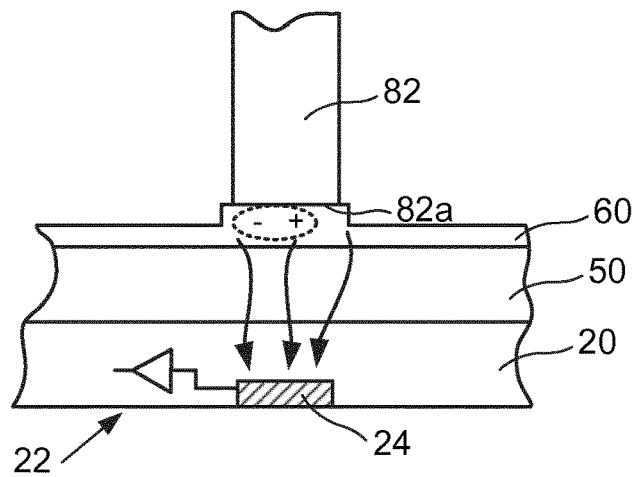
FIG. 7a-7b illustrates charge collection of carriers provided by rods of a SWIR conversion layer.
Figure 7B:
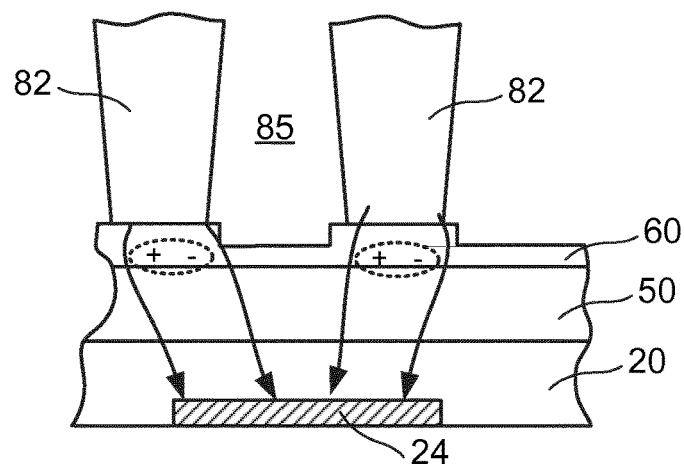
Figure 7C:
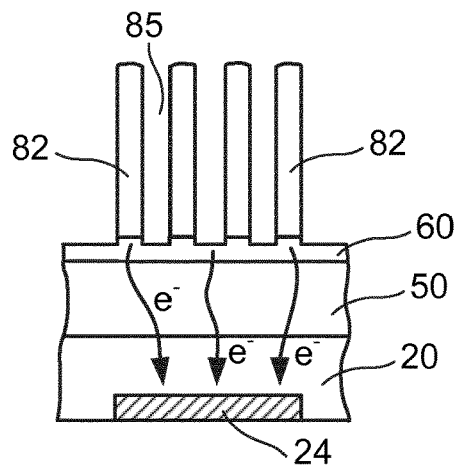

In a variant, illustrated in FIG. 7a a single rod 82 has its basis 82a facing a single charge collecting area 84. As illustrated in the variants of FIGS. 7b-c a bundle of rods 82 may face a single charge collecting area 24. Preferably said rods 82 have an orientation perpendicular to the plane of said substrate layer 50, but they may have a predetermined angle relative to the substrate layer 50. The cross section of said rods 82 may have any shape and their shape may vary according to their position in the array of rods 82. For example the shape of a cross section of said rods 82, defined perpendicular to its length L, may be substantially hexagonal, rectangular, or circular.

In a variant illustrated in FIG. 7b the rods 82 may have a conical shape. The conical shape may be so that its largest cross section is situated at the upper surface 82a so as to enhance the internal angle of reflection on the side wall of the rods. It is also understood that the array of rods 82 may comprise different shaped rods 82 and may comprise a portion of rods 82 that have a different chemical composition. In some applications of the device the central portion of the array of rods, defined in the plane of said array of rods 82, may have a different chemical composition than the rods 82 situated at the outside border portion of the array of rods 82.

It is understood that the packing density of the array of rods 82 may be different in different portions of said array of rods 82.

Said rod basis 82a may be equal to or may be smaller or greater than said upper surface 82a. A rod 12 may have for example a wide cylindrical portion to the side of said rod basis 82a and may have a thinner cylindrical portion to the side of said upper surface 82b. Also, the shape of the rods 82 may vary according to their position in the array of rods 82.

It is also understood that the chemical composition of at least a portion of the rods may vary from its basis 82a up to its upper surface 82b. For example, a first portion of a rod 82, to the side of its basis 82a, may have a higher Sn content than a second portion to said rod to its upper surface 82b. The rods may comprise, in its length, a step in the concentration of Sn. The Sn concentration may also be a continuous gradient along the length of the rods.

It is also understood that said rods 82 may have a radial index distribution, similar to graded index fiber optics. This radial index distribution may be realized by specific dopants and/or by a radial distribution of the Sn concentration.

It is understood that said rods 82 may comprise a variety of dopants. For example, a p-type layer may be formed by $BF_2^+$ ion implantation. Boron via $B_2H_6$ may also be a candidate of choice [Margetis, 2014]. For an n-type layer, phosphorous (via $PH_3$) will be preferred.

Preferred sizes of said rods 82 are:
length: preferably between 1 μm and 20 μm;
largest cross section: preferably between 1 μm and 5 μm.

It is generally understood that the width of said trenches and/or said elevated regions are preferably chosen in accordance with the thermal mismatch in order to reduce at most the formation of thermal cracks during the bonding process or during a post-bonding anneal.

The rods 82 are configured to convert an incident photon into an electron-hole pair and have an infrared light guiding function at least to their incident light side. The array of rods 82 in the SWIR conversion layer 80 allows for improved properties compared to a light conversion layer that would be made of a continuous layer.

In an embodiment the SWIR conversion layer may comprise a doped layer and this doped layer may be covered by an electrical contact layer 90. In variants said contact layer 90 may be formed by doping the incident light side of the photo-conversion layer 80. In a variant this doped layer is deposited to the incident light side of the photo-conversion layer 80.

In a variant electrical contact layer 90 may be a patterned electrical contact layer 90.

In a variant said contact layer 90 may comprise a patterned electrical contact layer.

The electrical contact layer 90 may be a patterned metal layer or a patterned conducting layer made of a non-metallic material such as ZnO. Said contact layer 90 may be any electrical conducting semiconductor layer which is transparent to SWIR. Said contact layer 90 must not necessarily have a uniform thickness.

In an embodiment the intermediate silicon layer 50 comprises a p-n junction. In an embodiment said intermediate layer 50 comprises a slightly doped layer adjacent to the support layer 60 having the same doping type and another slightly doped layer of opposite type adjacent to silicon wafer 20. In a variant the absorber layer 80 may be a doped layer.

The bonding interface may be situated to one of both sides of p-n junction. In an embodiment said intermediate silicon layer 50 comprises the p-n junction. In another embodiment, the p-n junction is situated at the bonding interface. Still in another embodiment, the p-n junction is situated in the readout wafer to the side away from said photodetectors 24.

It is also generally understood that said photodetectors 24 may be arranged at any position inside the readout wafer 20.

It is understood that in embodiments of the invention the shape and/or the surface of said rods 82 may be configured so as to optimize the electrical field in the length and across of said rods. Also, said gaps 85 may comprise materials and/or structures which allow, in operation of the detector array 1, to confine the electrical field lines inside said rods 82.

A cross section of an embodiment of the detector 1 of the invention is illustrated in FIG. 6. In the embodiment of FIG. 6 the silicon layer 20 comprises n+ charge collectors 24, whereas the support layer is a p-doped layer and said contact layer 90 is a highly p-doped layer. In the embodiment of FIG. 6 said absorption layer 80 is non-doped. In a variant of said preferred embodiment said absorption layer 80 may be a doped layer. As illustrated in FIG. 6 a photon incident on the absorption layer 80 creates an electron-hole pair in the absorber 80. The hole is collected at the incident light side and the electron, created by the absorption of a photon, drifts to the multiplier region situated to the side of said charge collectors of the p-n junction and is accelerated to sufficient energy to initiate a chain of impact ionization events, creating offspring electron-hole pairs and leading to internal gain. In the Geiger mode, in which single photon can initiate an avalanche that is self-sustaining, carrier generation predominates over extraction leading to exponential growth of the current. In this mode the detector array has to be electrically reset by reducing the bias to below breakdown long enough to terminate the avalanche, a process known as quenching.

In a variant the avalanche photodiode structure of the detector array 1 may comprise further layers such as buffer layers and/or charge layers. Depending on the desired electrical performances of the detector array 1 the layers of the detector 1 may be configured so as to shape a predetermined electrical field profile across the avalanche structure of the detector. Shaping electrical field profiles is well known in the field and are not further commented here.

As further explained in the method section, said second layer II is electrically and mechanically connected, by bonding, to said bonding surface 1d of said first layer I so as to form a monolithic detector structure which does not comprise any gaps or voids between the layers I and II. This is preferably achieved by a low temperature bonding technique as described in detail further in the fabrication method section.

The SWIR detector array 1 of the invention allows to obtain a high SWIR conversion efficiency, defined as the ratio of the number of electron-hole pairs generated to the number of incident photons in said absorber layer II. In an embodiment the conversion efficiency is higher than 30%, preferably higher than 70% allowing for a higher detection accuracy. By adapting thicknesses and doping of the layers of the SWIR detector, a higher conversion efficiency can be reached. As an example, with a Sn content below 10%, the absorption at a wavelength of 1.5 μm is higher than 80% within a 3 μm thick conversion layer.

The FPA 1 of the invention may have a large lateral dimension of about 10×10 cm$^2$ for one tile or even 50×50 cm$^2$ by stitching tiles—or any other juxtaposition technique.

It is understood that the detector array 1 of the invention may be configured in different electrical operational modes. More precisely by construction, the monolithic FPA of the invention may be designed in order to either time stamp photons or count them. It means that each photon arrival is digitally recorded by the activated pixel circuit. The monolithic FPA of the invention is therefore suitable also for energy discrimination, whereby the energy of photons incident on the sensor can be analyzed by the electronic circuit 22. Because digitization occurs within the pixels of the detector array, there is no need for analog circuitry in the readout path, and therefore this photon counting feature in the FPA of the invention eliminates readout noise. Thus, the single-photon counting highly sensitive SWIR FPA offers a reliable solution to avoid collisions of unmanned—aerial or terrestrial—vehicle.

The FPA of the invention comprising an array of single-photon avalanche diodes (SPAD) may further operate at room-temperature or eventually Peltier-cooled operation.

It is understood that the readout electronics of the detector 1 may be arranged to convert electrical signals into digital signals which can be stored and/or processed and that said digital signals may be further displayed as images on a computer screen.

Figure 9:
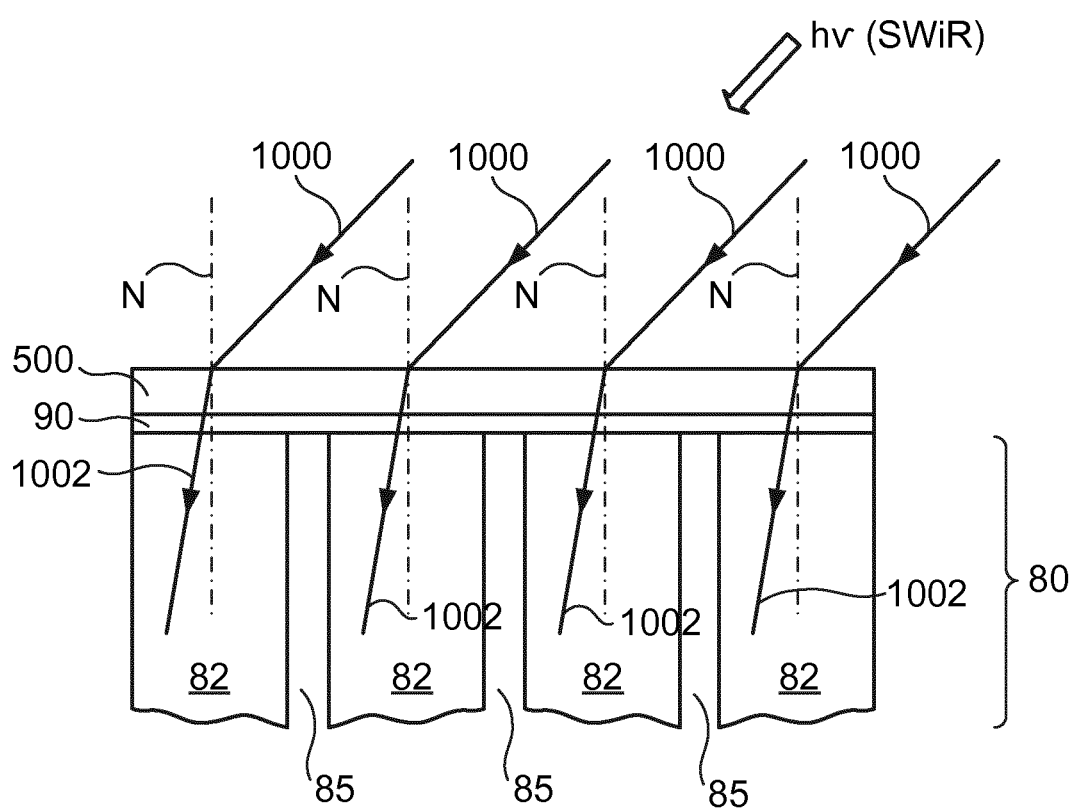
FIG. 9 illustrates the in coupling of SWIR light by an optical layer.
Figure 10:
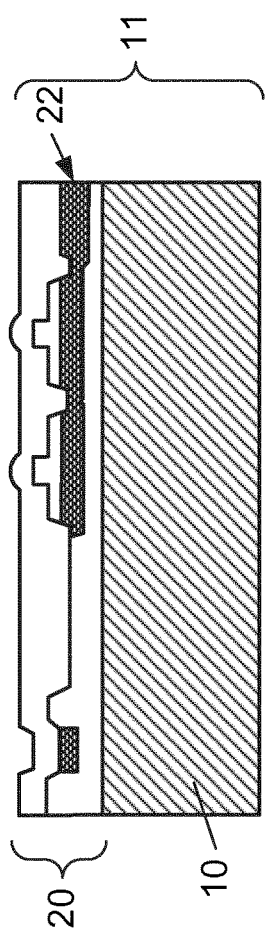

Referring now to FIG. 9, an optical layer 500 may be adapted to the detector array 1, comprising rods in the absorption layer 80, to deviate incident sideways radiation 1000, so that the light in coupling of light rays 1002 coupled inside the rods is improved, and so as to improve the light guiding efficiency of the rods 82, which enhances the light absorption of incident photons on said rods 82. Different variants of said optical layer 500 are possible. For example said optical layer 500 may comprise: refractive microlens, diffractive microlens array, aspheric shaped microlens arrays, microprism arrays. The optical layer may also comprise plasmonic planar metalenses allowing multi/hyper-spectral imaging and analysis. It is understood that said optical layer may comprise a stack of optical layers and may comprise optical shutters such as an array of electrostatically driven micro shutters, such as mems silicon micro shutters, which may be used to improve detection performances of optical systems in which the detector array 1 is implemented.

The invention is also achieved by a method of fabrication comprising a readout wafer I and an absorber wafer II comprising a Ge strain-relaxed buffer (SRB) layer 60, said absorbing wafer II comprising a $Ge_{1-x}Sn_x$ layer deposited on said SRB layer 60, said readout wafer I and absorbing wafer II being separated by an interfacial layer 2.

The method of fabrication of the invention comprises the following essential steps (A-E) of:

A. fabricating a readout wafer I comprising a CMOS readout layer 20 having a first surface 1c;
B. fabricating an absorber wafer II, having a second surface 1d, and comprising a buffer layer 60;
C. performing a covalent bonding between said first 1c and second 1d surfaces, providing a bonding interface 1c-1d;
D. sending heat radiation 210, provided by a light source. The heat radiation is preferably provided by the combined light beams emitted from multiple oscillators 200, and is situated to the side opposite to said readout wafer I relative to said buffer layer 60, to the direction and through said buffer layer 60 and through an a-Si interfacial layer 2 that separates said readout wafer I and said absorber layer, and so as to recrystallize said a-Si interfacial layer by the heat provided by said light beams 200 and so that temperature of the CMOS readout layer 20 remains lower than 350° C. during the recrystallization process;
E. depositing on said buffer layer 60, at temperatures lower than 350° C., a photo-conversion layer 80 of $Ge_{1-x}Sn_x$.

The preferred embodiments of the detailed process steps are illustrated in the cross sections of FIGS. 16-25.

In an embodiment the recrystallization temperature of the a-Si interfacial layer 3 during the recrystallization process step D remains lower than 650° C.

In an embodiment the recrystallization temperature of the a-Si interfacial layer 3 during the recrystallization process step D is higher than 550° C. The recrystallization process may also be performed at temperatures comprised between 450° C. and 650° C.

In an embodiment the temperature of said buffer layer 60 remains lower than 800° C. during the recrystallization step D of said a-Si interfacial layer 3. Different temperature profiles may be conceived depending on the particular composition of the layers and the characteristics of the light radiation 200 that provides the heat for the recrystallization process step.

Figure 3:
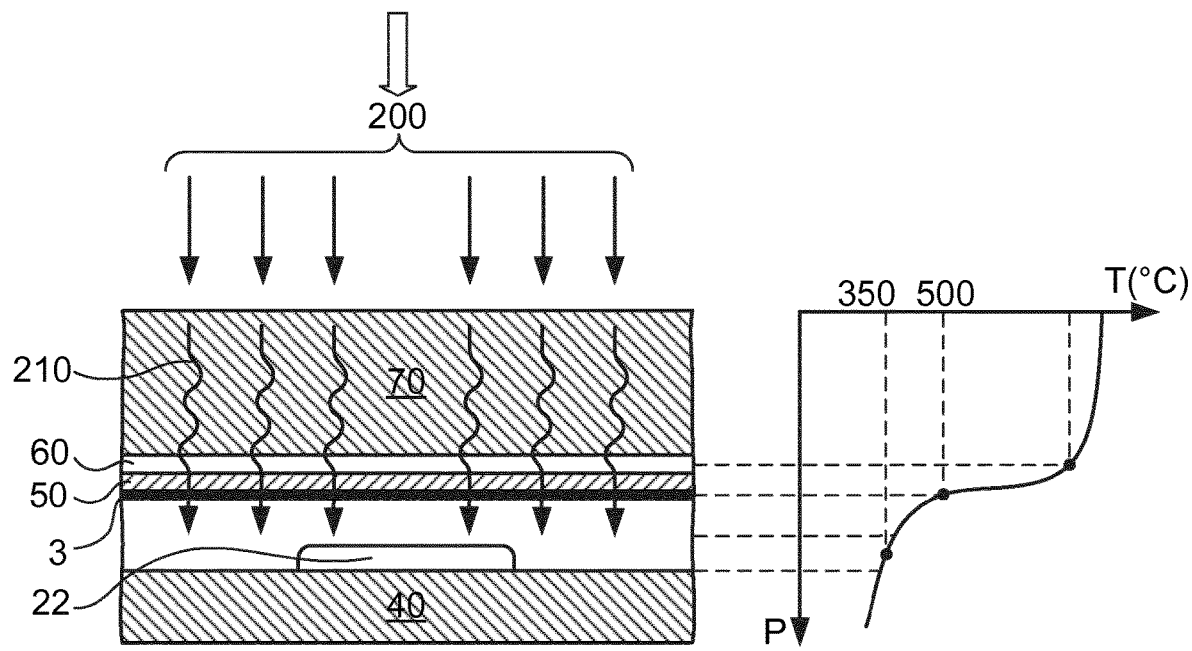
FIG. 3 illustrates the temperature profile, during the recrystallization process step of an a-Si interfacial layer situated between a portion of the absorber wafer and the readout wafer of the SWIR photodiode structure of the invention.

An exemplary temperature profile that may be obtained by the method of fabrication is shown in FIG. 3. The temperature curve shows the temperatures of the different layers produced by the propagating heat radiation 210.

In an embodiment, illustrated in FIG. 18 during the crystallization step D, the absorber wafer II comprises a carrier layer 70 situated on the buffer layer 60. The carrier layer 70 is situated to the side away of said a-Si interfacial layer 3, and has a top surface 70a away from said buffer layer 60. The temperature profile, from said top surface 70a to said readout layer 20, provided by said light beam 200 is such that:

the temperature of said buffer layer 60 is lower than 800° C. and the temperature of said a-Si interfacial layer 3 is higher than 450° C., preferably higher than 500° C.

In another embodiment, illustrated in FIG. 19 the crystallization step D may be performed when said carrier layer 70 is removed. In that case, the absorber wafer II comprises, during the crystallization step D, a buffer layer 60 situated to the side away of said a-Si interfacial layer 3, and has a buffer top surface 62 away from said a-Si interfacial layer 3. The temperature profile, from said buffer top surface 62 to said readout layer 20, provided by said light beam 200 is such that:

the temperature of said buffer layer 60 is lower than 800° C. and the temperature of said a-Si interfacial layer 2 is higher than 450° C., preferably higher than 500° C.

In an embodiment the light source is a laser, providing in operation, a laser beam 200 having a wavelength that is comprised between 400 nm and 900 nm.

In an embodiment the pulse duration of said light pulses (210) is lower than 1 ms and preferably lower than 100 ns.

In an embodiment the readout wafer I and/or the absorber wafer II undergo an ion or electron beam irradiation so that the recrystallization temperature of said a-Si interfacial layer 3 is reduced by at least 100° C. Ions that may be used to achieve this effect are Ar+ ions.

Figure 12:
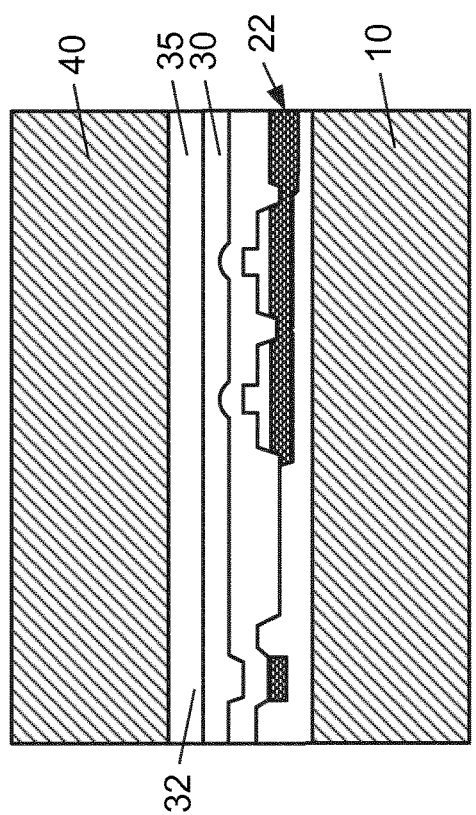
Figure 11:
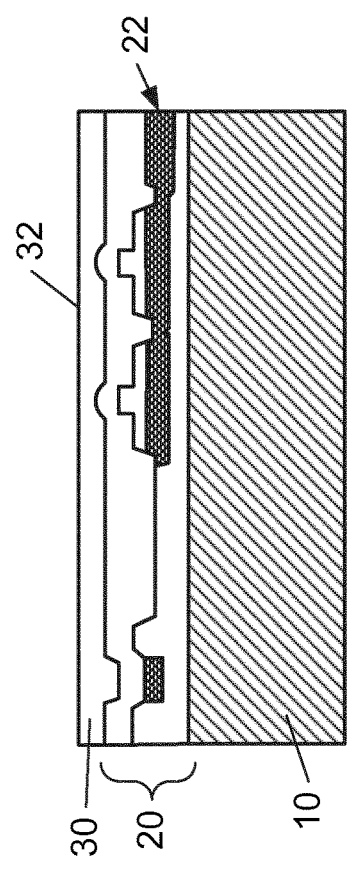
Figure 13:
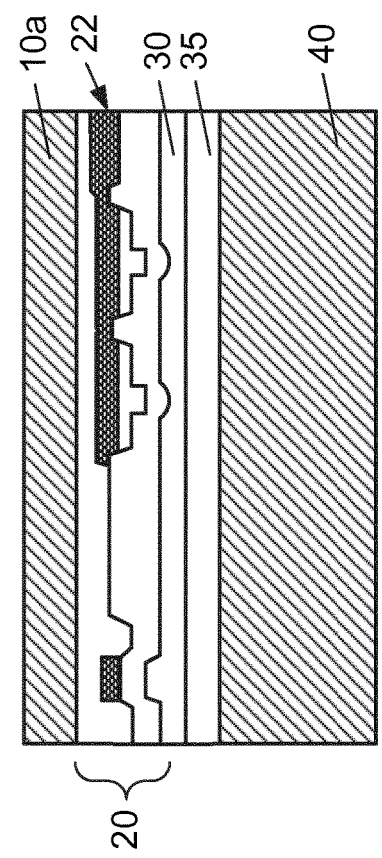
Figure 14:
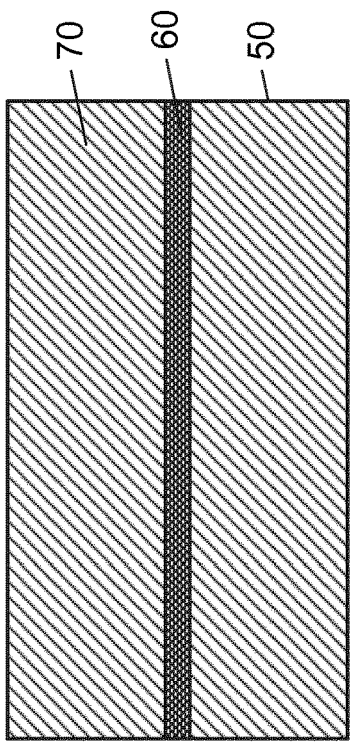
Figure 16:
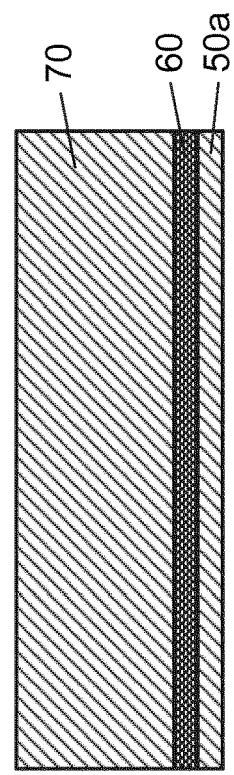
Figure 15:
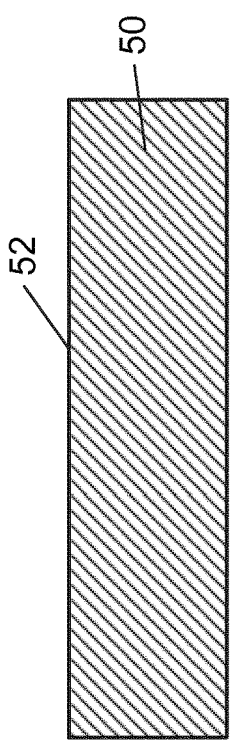
Figure 17:
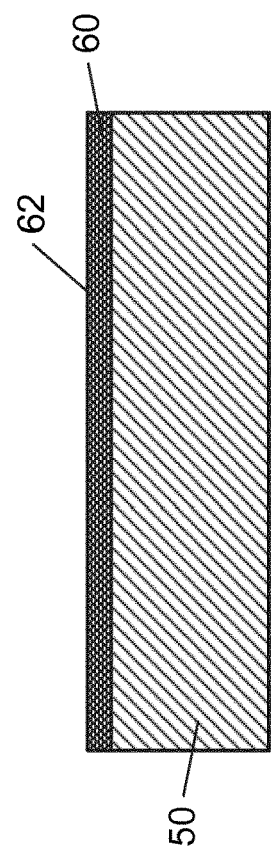
Figure 24:
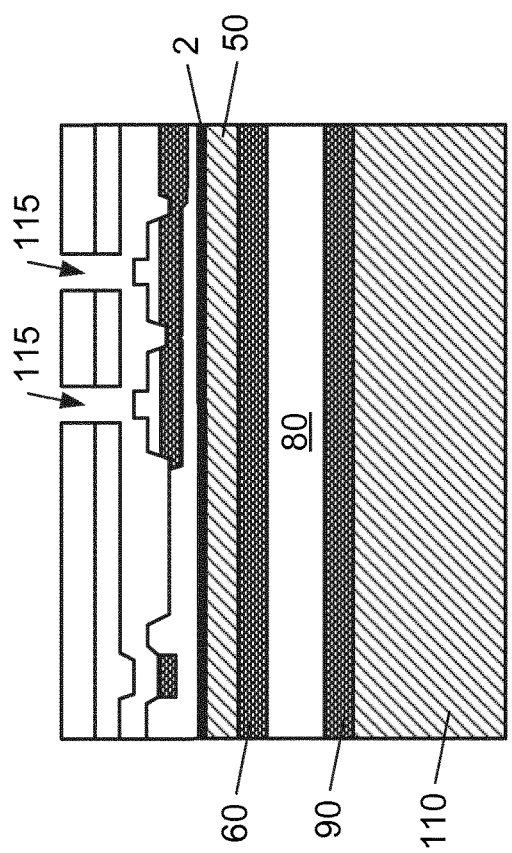
Figure 25:
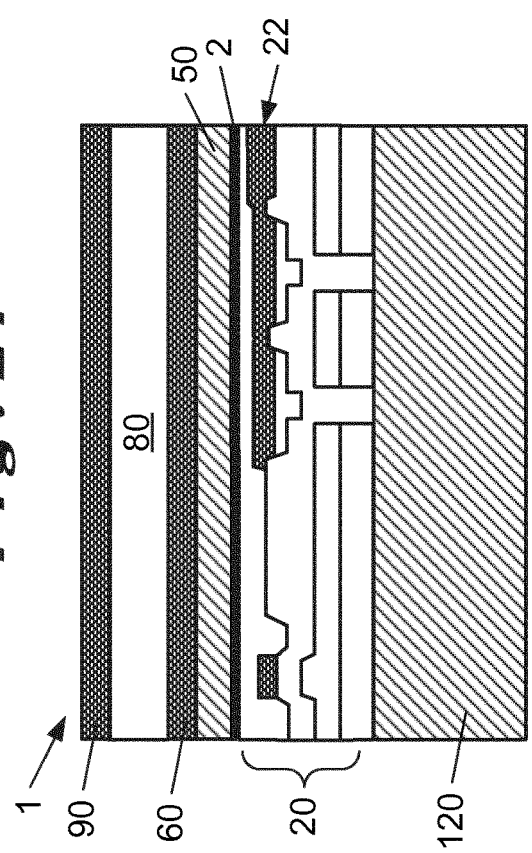
Figure 22:
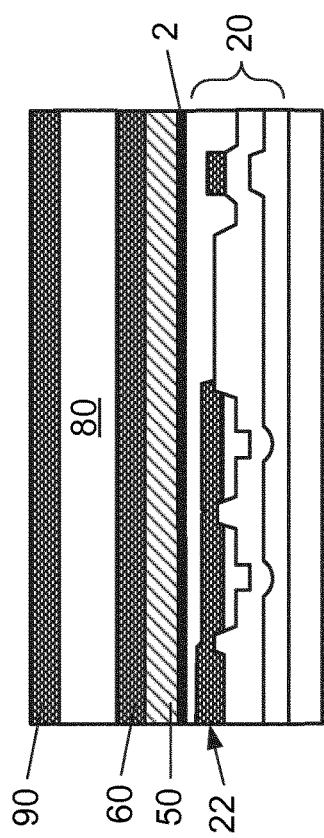
Figure 23:
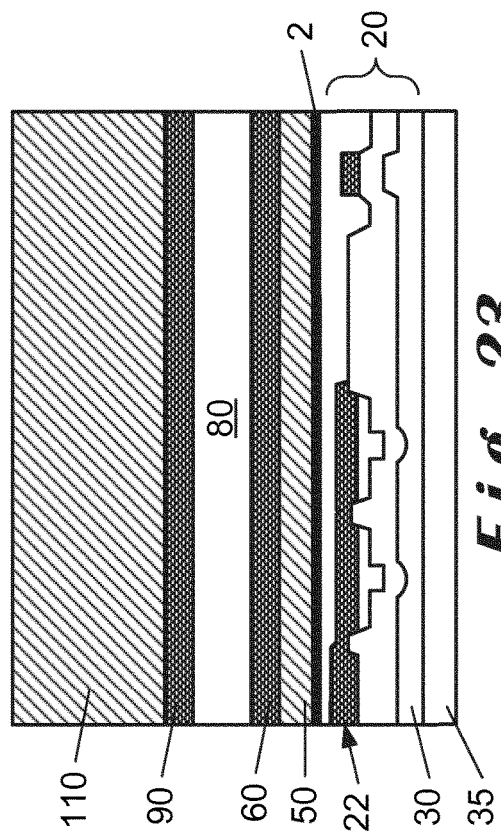

In an embodiment, the fabrication of said readout wafer I, illustrated by the cross sections illustrated in FIGS. 10-13, comprises the steps of:

a1) providing a SOI type wafer 11 being a low doped p or n type SOI wafer comprising a CMOS readout layer 20 comprising readout electronics 22 and a handle wafer 10;

a2) deposit an oxide layer 30 on said CMOS readout layer 20 so as to provide a plane oxide layer surface 32; in a variant an additional oxide layer 35 may be deposited as illustrated in FIG. 12;

a3) realize a readout carrier layer 40 on top of said plane oxide layer surface 32; in a variant said additional oxide layer 35 may be an oxide layer realized on said readout carrier layer 40;

a4) thinning said handle layer 10 so as to provide an epitaxial layer 10a;

a5) doping said epitaxial layer 10a so as to realize a p-n junction in said epitaxial layer 10a;

a6) providing a smooth, clean and oxide-free bonding surface 1d by chemical mechanical polishing and passivating.

In an embodiment, the fabrication of said absorber wafer II, illustrated by the cross sections illustrated in FIGS. 14-17, comprises the steps of:

b1) providing a substrate wafer 50, also defined as substrate layer 50, having either a p-type doping or n-type doping opposite to the doping of said SOI type wafer 11, said substrate wafer 50 having a growth surface 52;

b2) growing a buffer layer 60 having a first buffer layer surface 62 to the side away from said substrate wafer 50;

b3) realize a second carrier wafer 70 on said first buffer layer surface 62;

b4) thinning said substrate wafer 50;

b5) providing a clean and oxide free substrate wafer surface 54;

In an embodiment the buffer layer is a Ge layer. In an embodiment the buffer layer is a strain-relaxed buffer layer. Preferably the strain-relaxed buffer layer has a strain lower than 0.26%.

In an embodiment, shown by the cross sections illustrated in FIGS. 19-25, the following additional steps are performed after said recrystallization step E, illustrated in FIG. 18:

c1) removing said second carrier wafer 70;

c2) providing an oxide-free Ge surface 62;

c3) deposit a $Ge_{1-x}Sn_x$ absorber layer 80 on said oxide-free Ge surface 62;

c4) deposit a Ge contact layer 90 on said $Ge_{1-x}Sn_x$ absorber layer 80;

c5) removing said readout carrier layer 40;

c6) realize a secondary carrier 110 on said Ge contact layer 90;

c7) realizing opening contacts 115 through said oxide layer 30, 35;

c8) forming electrical contacts to said readout layer 20;

c9) removing said secondary carrier 110;

c10) realizing on said readout layer 20 a detector carrier layer 120;

In a variant, said second carrier wafer 70 is removed before said recrystallization process E.

In a variant of the method said $Ge_{1-x}Sn_x$ absorber layer 80 has a composition with a Sn content x between $0.02 \leq x \leq 0.15$.

In an embodiment, during said deposition process step E, rods 82 are formed that are made of $Ge_{1-x}Sn_x$.

In an embodiment the process of manufacturing comprises the additional step of providing an optical layer 500 on said Ge contact layer 90.

It is generally understood than anyone or several of the layers in the detector 1 of the invention may be uniform or non-uniform layers. Non uniform layers are not limited to layers which thickness varies continuously over the width of the layers, nut may comprise steps or any other structured profiles. The detector of the invention may comprise further layers that the skilled person may conceive such as temperature compensation layers or layers that improve the adherence between two layers. In embodiments doping profiles, in the direction of the thickness of the layers may depend on the local position in the layer. For example in the center of a layer, defined in its width, the doping may be higher or lower than the doping at the lateral sides of the layer.

Simulation Results

Figure 26:
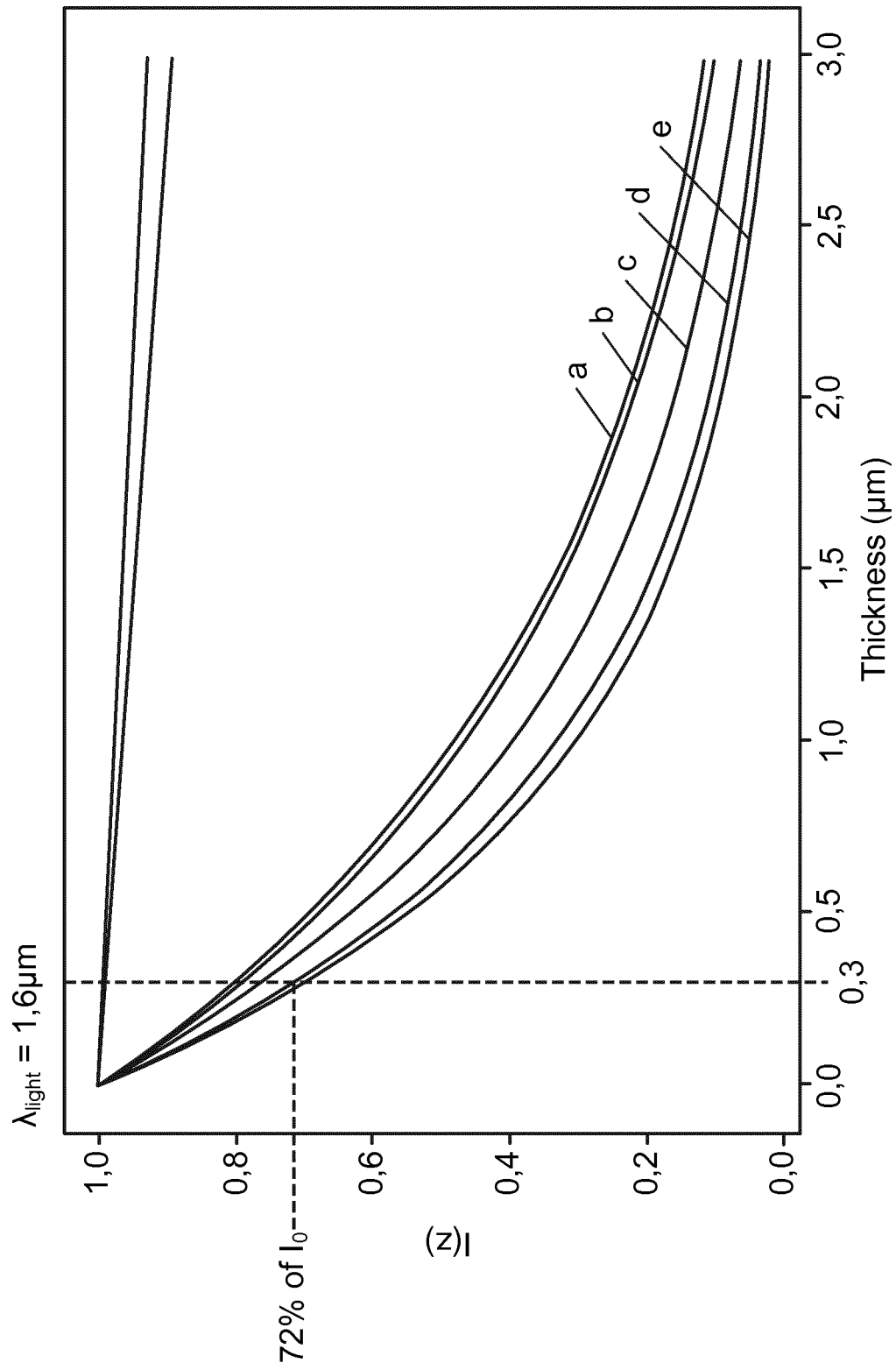
FIG. 26 shows simulation results of a SWIR detector of the invention.

First simulation results are illustrated in FIG. 26. The curves show the variation of the intensity through the $Ge_{1-x}Sn_x$ layer in function of the depth in the layer. The incident light intensity is $I_0$. The curves a-e show curves corresponding to layers having a Sn content from 3 to 10% Sn. The other two curves at the top show Sn contents of 0 and 1% Sn content. It can be seen that between a content of Sn of 3 to 10% about 30% (i.e. 72% of $I_o$) is absorbed in the first 0.3 µm of the layer. FIG. 26 shows that more than 70% of SWIR light is absorbed at the wavelength of 1.6 µm within 3 µm of thickness of a $Ge_{1-x}Sn_x$ absorber material.

Efficiencies of more than 80% of absorption can be obtained by changing the characteristics of the layers.

Exemplary Applications

The FPA of the present invention may be used in various types of applications such as ground, airborne and space technology for intelligence, surveillance, military and security systems. It may also be used for encryption systems, spectroscopy, machine vision or non-invasive clinical investigations such as optical coherence tomography. More precisely, the FPA of the present invention can be integrated into and used in methods of the following fields of applications as described below.

LIDAR

System-level benefits of large FPAs are related to providing a large instantaneous field of view and a fully electronic selection by reading out a region of interest (FOV). Large FPAs allow monitoring of large areas and enable key applications, such as high-resolution, wide-area airborne persistent surveillance. The detector larger format with smaller pixel size helps to solve the unmanned—aerial or terrestrial—vehicle (UV) automated "sense and avoid" problem. By using an array of detectors in a FPA, the mechanical scanning needed in single-detector systems can be avoided and because a photon-counting FPA has the ability to digitally time stamp individual photon arrivals it is an enabler for highly sensitive light detection and ranging ("LIDAR") imaging systems. In a LIDAR system the scene is illuminated by a short laser pulse, and imaged onto the FPA, where each single-photon avalanche diode measures photon arrival time, and therefore depth to the corresponding point in the scene whereas the image is built up by combining multiple frames.

Multi/Hyper-Spectral LIDAR Imaging

Most minerals contain distinct absorption features in the SWIR, making this region of the spectrum the best candidate for spectroscopic analysis in many applications. Hydroxyl bearing minerals, sulfates, and carbonate materials produced naturally on earth—or directly related to human activities such as the burning of fossil fuels and the deforestation—are easily identified through SWIR spectroscopy. Multi/hyper-spectral LIDAR imaging can thus provide a powerful tool for mapping, archaeology, earth science, glaciology, agricultural assessment and disaster response.

REFERENCES

The following US patent documents, foreign patent documents, and Additional Publications are incorporated herein by reference thereto and relied upon:

US Patent Documents

20120260847 A1 April 2011 Van Der Wilt P. C.

Publications

1. Esther Y. et al., "Enhancement in Photoconductivity of a-Si Thin Films by Annealing ad Texturing Technique with the Third Harmonic Output from a Pulsed Nd31: YAG Laser, Procedia Manufacturing, 5, 734-746 (2016)
2. Fenouillet-Beranger C. et al., "New Insights on bottom layer thermal stability and laser annealing promises for high performance 3D monolithic integration." Conference paper, IEEE International Electron Devices Meeting (IEDM), 15-17 Dec. 2014 (2015)
3. Flötgen C. et al., "Novel surface preparation methods for covalent and conductive bonded interfaces fabrication", ECS Transactions 64, 103-110 (2014)
4. Li Q. "Investigation on solid-phase crystallization techniques for low temperature polysilicon thin-film transistors" Rochester Institute of Technology, Dissertation (2013)
5. Margetis J. et al., "Growth and characterization of epitaxial $Ge_{1-x}Sn_x$ alloys hetero structures using a commercial CVD system." ECS Trans, 64(6), 711 (2014);
6. Mathieu B. et al., "Thermal Simulation of Nanosecond Laser Annealing of 3D Sequential VLSI Structures." SISPAD Washington, Sep. 9-11, 2015
7. Pönninger A., "Oxide Free Direct Wafer Bonding", Prepared for and presented at Chemnitzer Seminar "System Integration Technologies", Jun. 23-24, 2015
8. Qi G. J. et al., "Experimental study of aluminum-induced crystallization of amorphous silicon thin films". Surface & Coatings Technology 198, 300-303 (2005)
9. Turchetta R. et al., "A monolithic active pixel sensor for charged particle tracking and imaging using standard VLSI CMOS technology", Nuclear Instruments and Methods in Physics Research A 458, 677-689 (2001)
10. Xu P. et al., "Ultra-shallow junction formed using microwave annealing", Applied Physics Letters 102, 122114 (2013)

The invention claimed is:

1. A method of fabrication of a short-wave infrared detector array (1) comprising a readout wafer (I) and an absorber wafer (II) comprising a buffer layer (60), said absorbing wafer (II) comprising a $Ge_{1-x}Sn_x$ layer deposited on said buffer layer (60), said readout wafer (I) and absorbing wafer (II) being separated by a recrystallized interfacial layer (2), the method comprising the steps (A-E) of:
   A. fabricating a readout wafer (I) comprising a CMOS readout layer (20) having a first surface (1c);
   B. fabricating an absorber wafer (II), having a second surface (1d), and comprising a buffer layer (60);
   C. performing a covalent bonding between said first (1c) and second (1d) surfaces, providing a bonding interface (1c-1d);
   D. sending light pulses (210), provided by a light source, emitting a light beam (200) and situated to the side opposite to said readout wafer (I) relative to said buffer layer (60), to the direction and through said buffer layer (60) and through an a-Si interfacial layer (3) that separates said readout wafer (I) and said absorber layer (II), and so as to recrystallize said a-Si interfacial layer (3) by the heat provided by said light pulses (210) and so that temperature of the CMOS readout layer (20) remains lower than 350° C. during the recrystallization process;
   E. depositing on said buffer layer (60), at temperatures lower than 350° C., a layer of $Ge_{1-x}Sn_x$ (80).

2. The method according to claim 1 wherein the recrystallization temperature of the a-Si interfacial layer (3) during the recrystallization process step D remains lower than 650° C.

3. The method according to claim 1 wherein the recrystallization temperature of the a-Si interfacial layer (3) during the recrystallization process step D is higher than 550° C.

4. The method according to claim 1 wherein the temperature of said buffer layer (60) remains lower than 800° C. during the recrystallization step D of said a-Si interfacial layer (3).

5. The method according to claim 1 wherein during the crystallization step D the absorber wafer (II) comprises a carrier layer (70) situated on said buffer layer (60), to the side away of said a-Si interfacial layer, said carrier layer (70) having a top surface (70a) away from said buffer layer (60), and wherein the temperature profile, provided by said light pulses (210), from said top surface (70a) to said readout layer (20), is such that:
   the temperature of said buffer layer (60) is lower than 800° C. and the temperature of said a-Si interfacial layer (3) is higher than 450° C.

6. The method according to claim 1 wherein during the crystallization step D the absorber wafer (II) comprises a buffer layer (60), situated to the side away of said a-Si interfacial layer 3, and having a buffer top surface (62) away from said a-Si interfacial layer 3, and wherein the temperature profile, provided by said light pulses (210), from said buffer top surface (62) to said readout layer (20), is such that:
the temperature of said buffer layer (60) is lower than 800° C. and the temperature of said a-Si interfacial layer (3) is higher than 450° C.

7. The method according to claim 1 wherein the light source is a laser, providing in operation, a laser beam (200) having a wavelength that is comprised between 400 nm and 900 nm.

8. The method according to claim 1 wherein the pulse duration of said light pulses (210) is lower than 1 ms and preferably lower than 100 ns.

9. The method according to claim 1 comprising a step wherein the readout wafer (I) and/or the absorber wafer (II) undergo an ion or electron beam irradiation so that the recrystallization temperature of said a-Si interfacial layer (3) is reduced by at least 100° C.

10. The method according to claim 1 wherein the fabrication of said readout wafer (I) comprises the steps of:
a1) providing a SOI type wafer (11) being a low doped p or n type SOI wafer comprising a CMOS readout layer (20) comprising readout electronics (22) and a handle wafer (10);
a2) deposit an oxide layer (30) on said CMOS readout layer (20) so as to provide a plane oxide layer surface (32);
a3) realize a readout carrier layer (40) on top of said plane oxide layer surface (32);
a4) thinning said handle layer (10) so as to provide an epitaxial layer (10a);
a5) doping said epitaxial layer (10a) so as to realize a p-n junction in said epitaxial layer (10a);
a6) providing a smooth, clean and oxide-free bonding surface (1d) by chemical mechanical polishing and passivating.

11. The method according to claim 1 wherein the fabrication of said absorber wafer (II) comprises the steps of:
b1) providing a substrate wafer (50) having either a p-type doping or n-type doping opposite to the doping of said SOI type wafer (11), said substrate wafer (50) having a growth surface (52);
b2) growing a buffer layer (60) having a first buffer layer surface (62) to the side away from said substrate wafer (50);
b3) realize a second carrier wafer (70) on said first buffer layer surface (62);
b4) thinning said substrate wafer (50);
b5) providing a clean and oxide free substrate wafer surface (54).

12. The method according to claim 11 wherein said buffer layer (60) is a Ge buffer layer.

13. The method according to claim 11 wherein said buffer layer (60) is a strain-relaxed buffer layer.

14. The method according to claim 13 wherein said strain-relaxed buffer layer (60) has a strain lower than 0.26%.

15. The method according to claim 1 comprising, after said recrystallization step E, the following additional steps:
c1) removing said second carrier wafer (70);
c2) providing an oxide-free Ge surface (62);
c3) deposit a $Ge_{1-x}Sn_x$ absorber layer (80) on said oxide-free Ge surface (62);
c4) deposit a Ge contact layer (90) on said $Ge_{1-x}Sn_x$ absorber layer (80);
c5) removing said readout carrier layer (40);
c6) realize a secondary carrier (110) on said Ge contact layer (90);
c7) realizing opening contacts (115) through said oxide layer (30, 35);
c8) forming electrical contacts to said readout layer (20);
c9) removing said secondary carrier (110);
c10) realizing on said readout layer (20) a detector carrier layer (120).

16. The method according to claim 1 wherein said $Ge_{1-x}Sn_x$ absorber layer (80) has a composition with a Sn content x between $0.02 \leq x \leq 0.15$.

17. The method according to claim 1 wherein that during said deposition process step E rods (200) are formed made of $Ge_{1-x}Sn_x$.

18. The method according to claim 1 comprising the additional step of providing an optical layer (500) on said Ge contact layer (90).

19. A short-wave infrared (SWIR) detector array (1), realized according to method claim 1, comprising at least one SWIR light conversion layer (80) having an incident light surface (1a) and comprising a doped readout wafer (20) being either p-doped or n-doped comprising:
an array of charge collecting areas (24) being either p-doped or n-doped charge collecting areas (24);
an electrical circuit (22) situated in said readout wafer (20) and comprising a detector array (x) being configured to detect electromagnetic waves having a wavelength comprised between 1.0 μm and 3.0 μm,
wherein:
said SWIR detector array (1) comprises a detector carrier layer (120); to the side opposite to the SWIR light conversion layer (80) incident light side;
said SWIR detector array (1) further comprises a recrystallized intermediate layer (2) at the bonding interface (1c-1d), said intermediate layer (30) being arranged in between said substrate layer (50) and said readout wafer (20);
a p-n junction is realized at the location of said recrystallized intermediate layer (2);
said SWIR light conversion layer (80) is arranged on a buffer layer (60) and has a $Ge_{1-x}Sn_x$ alloy composition and comprises, to the side away from said recrystallized intermediate layer (2) a doped contact layer (10c) having a similar doping as said substrate layer (50).

20. The SWIR detector array (1) according to claim 19 wherein said p-n junction is situated to the side of said $Ge_{1-x}Sn_x$ absorber layer (80).

21. The SWIR detector array (1) according to claim 19 wherein said p-n junction is situated to the side of said readout layer (20).

22. The SWIR detector array (1) according to claim 19 wherein said p-n junction comprises said bonding interface and having a first portion situated to the side of said $Ge_{1-x}Sn_x$ absorber layer (80) and a second portion situated to the side of said readout layer (2c).

23. The SWIR detector array (1) according to claim 18 wherein said readout electrical circuit (22) is a CMOS type circuit processed in said readout layer (20c) so as to be accessible in said detector lower surface (1b).

24. The SWIR detector array (1) according to claim 18 wherein said light conversion layer (10) has a thickness t1, defined in a direction perpendicular to said support layer (40) of more than 350 nm.

25. The SWIR detector array (1) according to claim 18 wherein said Ge buffer layer (60) is a patterned layer and comprises trenches (61) and elevated regions (63) to the Ge buffer layer's incident light side.

26. The SWIR detector array according to claim 18 wherein said buffer layer is a Ge layer.

27. The SWIR detector array according to claim 18 wherein said buffer layer is a strain-relaxed layer having a tensile stress lower than 0.26%.

28. The SWIR detector array (1) according to claim 18 wherein said SWIR light conversion layer (80) is internally structured and comprises rods (82) extending between said substrate layer (50) and said contact layer (90).

29. The SWIR detector array (1) according to claim 28, wherein said rods (82) have, defined in any cross section perpendicular to their length L, a <100> crystallographic orientation.

30. The SWIR detector array (1) according to claim 28, wherein a greatest width of said rods (82), taken in any said cross section, is comprised between 1 μm and 7 μm.

31. The SWIR detector array (1) according to claim 19 comprising, to the incident light side, an optical layer (500) adapted to direct incident light into said rods (12).

32. The SWIR detector array (1) according to claim 31 wherein said optical layer (500) comprises an array of refractive microlens, or an array of diffractive microlenses, or an array of aspheric shaped microlenses, or an array of microprisms or an array of plasmonic planar metalenses allowing for multi/hyper-spectral imaging and analysis.

33. The SWIR detector array (1) according to claim 19 wherein the detector is configured as an array of single-photon avalanche diodes.

* * * * *